United States Patent [19]
Nishikawa et al.

[11] Patent Number: 5,634,208
[45] Date of Patent: May 27, 1997

[54] MULTILAYER TRANSMISSION LINE USING GROUND METAL WITH SLIT, AND HYBRID USING THE TRANSMISSION LINE

[75] Inventors: Kenjiro Nishikawa; Ichihiko Toyoda; Tsuneo Tokumitsu, all of Yokosuka; Kenji Kamogawa, Yokohama, all of Japan

[73] Assignee: Nippon Telegraph and Telephone Corporation, Tokyo, Japan

[21] Appl. No.: 622,044

[22] Filed: Mar. 26, 1996

[30] Foreign Application Priority Data

Mar. 28, 1995 [JP] Japan ..................... 7-069769

[51] Int. Cl.$^6$ ............... H04B 1/26; H01P 3/08; H01P 5/12; H01P 5/16
[52] U.S. Cl. ............... 455/327; 333/1; 333/112; 333/116; 333/118; 333/120; 333/128; 333/238
[58] Field of Search ............... 333/1, 112, 116, 333/118, 120, 128, 136, 238, 246; 455/302, 325, 327, 333

[56] References Cited

U.S. PATENT DOCUMENTS

| 3,575,674 | 4/1971 | Howe, Jr. ............. | 333/116 |
|---|---|---|---|
| 3,659,228 | 4/1972 | Napoli . | |
| 3,715,689 | 2/1973 | Laughlin ............. | 333/128 |
| 3,771,075 | 11/1973 | Phelan . | |
| 5,303,419 | 4/1994 | Ittipiboon et al. ............. | 455/327 |
| 5,446,425 | 8/1995 | Banba ............. | 333/116 |

FOREIGN PATENT DOCUMENTS

A-58-030206  2/1983  Japan .

OTHER PUBLICATIONS

"Multilayer MMIC Branch–Line Coupler and Broad–Side Coupler", Toyoda et al, NTT Radio Communication Systems Laboratories, IEEE 1992 Microwave and Millimeter–Wave Monolithic Circuits Symposium, pp. 79–82.

"Slot–Coupled Directional Couplers Between Double–Sided Substrate Microstrip Lines and Their Applications", Tanaka et al, IEEE Transactions on Microwave Theory Techniques, vol. 36, No. 12, Dec. 1988, pp. 1752–1757.

"Three–Dimensional MMIC Technology: A Possible Solution to Masterslice MMIC's on GaAs and Si", Tokumitsu et al, IEEE Microwave and Guided Wave Letters, vol. 5, No. 11, Nov. 1995, pp. 411–413.

"A Novel Minature Wilkinson Divider Using Aperture–Ground Plane and Application to 3D–MMIC K–band Receiver" Nishikawa et al, The Institute of Electronics, Information and Communication Engineers, Technical Report of IEICE, MW95–69(1995–07), pp. 77–82.

"Reduced–Size Branch–Line and Rat–Race Hybrids for Uni–planer MMIC's", Hirota et al, IEEE Transactions on Microwave Theory and Techniques, vol. 38, No. 3, Mar. 1990, pp. 271–275.

"Reduction of the attenuation constant of microstrip", L. J. Albrey, et al., IEEE Transactions on Microwave Theory and Techniques, vol. 22, No. 7, Jul. 1974, pp. 739–742.

*Primary Examiner*—Paul Gensler
*Attorney, Agent, or Firm*—Spencer & Frank

[57] ABSTRACT

A hybrid including a substrate, a first dielectric layer, a ground metal, and a second dielectric layer, which are stacked in this order. Transmission lines are formed below and above the ground metal, and a slit is formed in the ground metal at a position corresponding to projection of the transmission lines onto the ground metal. The substrate has a greater dielectric constant than the dielectric layers. This makes it possible to prevent coupling between the upper and lower transmission lines, thereby implementing a high impedance, low loss transmission lines.

26 Claims, 45 Drawing Sheets

MULTILAYER TRANSMISSION LINE USING GROUND METAL WITH SLIT, AND HYBRID USING THE TRANSMISSION LINE

BACKGROUND OF THE INVENTION

1. Field of The Invention

The present invention relates to an MMIC (Monolithic Microwave Integrated Circuit), and more particularly to a multilayer transmission line using a ground metal with a slit, and a hybrid using the transmission line, in which signal lines are formed on dielectric layers provided on both sides of the ground metal with the slit.

In this specification, dielectric refers to not only plastic such as polymer based dielectric material, but also ceramics and semiconductors.

2. Description of Related Art

An MMIC of such a structure is known that a ground metal with a slit is sandwiched by two dielectric layers, and transmission lines are formed on the outer surfaces of the dielectric layers. For example, Toshiaki Tanaka, et al. "Slot-Coupled Directional Couplers Between Double-Sided Substrate Microstrip Lines and Their Applications", IEEE Transactions on Microwave Theory and Techniques, Vol. 36, No. 12, December 1988 discloses directional couplers with such a structure that a ground plane is sandwiched between two substrates with microstrip lines on respective outer substrate surfaces. U.S. Pat. No. 5,303,419 entitled to Ittipiboon et al. discloses magic-tees with a similar structure.

In these microwave hybrids, the slots are formed in the ground metals for providing coupling between the upper and lower signal lines. In other words, the signal lines function as coupled lines which are coupled with each other via the slots. This makes it possible to provide miniature, high performance hybrids.

These slots formed on the ground metals, on the other hand, have a function to reduce the capacitance between the upper and lower signal lines. The present invention, taking account of this, develops novel, miniature, inexpensive transmission lines and hybrids.

SUMMARY OF THE INVENTION

An object of the present invention is to provide a miniature, low loss multilayer transmission line using a ground metal with a slit, and hybrids using the transmission lines.

In a first aspect of the present invention, there is provided a transmission line comprising:

a substrate;

a first dielectric layer formed on the substrate;

a ground metal formed on the first dielectric layer;

a second dielectric layer formed on the ground metal;

a first transmission line formed between the substrate and the first dielectric layer;

a second transmission line formed on the second dielectric layer; and a slit formed in the ground metal, wherein the substrate has a greater dielectric constant than the first dielectric layer.

Here, the slit may be formed at a position defined by projecting the first transmission line and the second transmission line onto the ground metal.

The substrate may comprise a third dielectric layer formed on the substrate, and the first transmission line may be formed between the third dielectric layer and the first dielectric layer.

The substrate may be a semiconductor substrate.

The substrate may be a dielectric substrate.

The substrate may be a ceramic substrate.

In a second aspect of the present invention, there is provided a Wilkinson divider including two or more quarter-wavelength transmission lines, the Wilkinson divider comprising:

a substrate;

a first dielectric layer formed on the substrate;

a ground metal formed on the first dielectric layer;

a second dielectric layer formed on the ground metal;

a first transmission line formed between the substrate and the first dielectric layer;

a second transmission line formed on the second dielectric layer; and a slit formed in the ground metal, wherein the substrate has a greater dielectric constant than the first dielectric layer, and the first transmission line and the second transmission line constitute the quarter-wavelength transmission lines of the Wilkinson divider.

Here, the Wilkinson divider may be a single-stage two-output Wilkinson divider, and the first transmission line and the second transmission line may each include one of the quarter-wavelength transmission lines.

The Wilkinson divider may be a multi-stage Wilkinson divider, and the first transmission line and the second transmission line each may include at least two of the quarter-wavelength transmission lines.

The Wilkinson divider may be a multi-output Wilkinson divider with three or more outputs, and at least one of the first transmission line and the second transmission line may include a plurality of quarter-wavelength transmission lines with their one ends connected to an input port and the other ends connected to the outputs.

In a third aspect of the present invention, there is provided a 90 degree branch-line hybrid including four quarter-wavelength transmission lines connected in a loop fashion, the 90 degree branch line hybrid comprising:

a substrate;

a first dielectric layer formed on the substrate;

a ground metal formed on the first dielectric layer;

a second dielectric layer formed on the ground metal;

a first transmission line formed between the substrate and the first dielectric layer;

a second transmission line formed on the second dielectric layer; and a slit formed in the ground metal, wherein the substrate has a greater dielectric constant than the first dielectric layer, and the first transmission line and the second transmission line constitute the quarter-wavelength transmission lines of the 90 degree branch-line hybrid.

Here, the 90 degree branch-line hybrid may be a multi-stage 90 degree branch line hybrid, and the first transmission line and the second transmission line may each include at least three quarter-wavelength transmission lines.

In a fourth aspect of the present invention, there is provided a quasi-lumped 90 degree branch-line hybrid including wavelength transmission lines connected in a loop, and capacitors connected between ground and respective connecting points of the wavelength transmission lines, the quasi-lumped 90 degree branch-line hybrid comprising:

a substrate;

a first dielectric layer formed on the substrate;

a ground metal formed on the first dielectric layer;

a second dielectric layer formed on the ground metal;

a first transmission line formed between the substrate and the first dielectric layer;

a second transmission line formed on the second dielectric layer; and a slit formed in the ground metal, wherein the substrate has a greater dielectric constant than the first dielectric layer, and the first transmission line and the second transmission line constitute the wavelength transmission lines of the quasi-lumped 90 degree branch-line hybrid.

Here, the first transmission line and the second transmission line may each include $1/12$ wavelength transmission line and $1/8$ wavelength transmission line, which are connected alternately in a loop.

The quasi-lumped 90 degree branch-line hybrid may be a multi stage quasi-lumped 90 degree branch-line hybrid, and the first transmission line and the second transmission line may each include at least three wavelength transmission lines.

In a fifth aspect of the present invention, there is provided a 180 degree rat-race hybrid including a ¾ wavelength transmission line and three quarter-wavelength transmission lines connected in a loop, the 180 degree rat-race hybrid comprising:

a substrate;

a first dielectric layer formed on the substrate;

a ground metal formed on the first dielectric layer;

a second dielectric layer formed on the ground metal;

a first transmission line formed between the substrate and the first dielectric layer;

a second transmission line formed on the second dielectric layer; and a slit formed in the ground metal, wherein the substrate has a greater dielectric constant than the first dielectric layer, and the first transmission line and the second transmission line constitute the a ¾ wavelength transmission line and the quarter-wavelength transmission lines of the 180 degree rat-race hybrid.

In a sixth aspect of the present invention, there is provided a quasi-lumped 180 degree rat-race hybrid including wavelength transmission lines connected in a loop, and capacitors connected between ground and respective connecting points of the wavelength transmission lines, the 180 degree rat-race hybrid comprising:

a substrate;

a first dielectric layer formed on the substrate;

a ground metal formed on the first dielectric layer;

a second dielectric layer formed on the ground metal;

a first transmission line formed between the substrate and the first dielectric layer;

a second transmission line formed on the second dielectric layer; and a slit formed in the ground metal, wherein the substrate has a greater dielectric constant than the first dielectric layer, and the first transmission line and the second transmission line constitute the wavelength transmission lines of the quasi-lumped 180 degree rat-race hybrid.

Here, the first transmission line may include two $1/8$ wavelength transmission lines and the second transmission line may include one $1/8$ wavelength transmission line, which are connected in a loop with a capacitor.

In a seventh aspect of the present invention, there is provided a reverse-phase hybrid ring including a 1:−1 transformer and three quarter-wavelength transmission lines connected in a loop, the phase inverting hybrid comprising:

a substrate;

a first dielectric layer formed on the substrate;

a ground metal formed on the first dielectric layer;

a second dielectric layer formed on the ground metal;

a first transmission line formed between the substrate and the first dielectric layer;

a second transmission line formed on the second dielectric layer; and a slit formed in the ground metal, wherein the substrate has a greater dielectric constant than the first dielectric layer, and the first transmission line and the second transmission line constitute the quarter-wavelength transmission lines of the phase inverting hybrid.

Here, the slits may be formed at positions defined by projecting the first transmission line and the second transmission line onto the ground metal.

The substrate may comprise a third dielectric layer formed between the substrate and the first dielectric layer, and the first transmission line may be formed between the third dielectric layer and the first dielectric layer.

The substrate may be a semiconductor substrate.

The substrate may be a dielectric substrate.

The substrate may be a ceramic substrate.

In an eighth aspect of the present invention, there is provided a receiver including an RF amplifier, and a mixer having a divider, the divider comprising:

a substrate;

a first dielectric layer formed on the substrate;

a ground metal formed on the first dielectric layer;

a second dielectric layer formed on the ground metal;

a first transmission line formed between the substrate and the first dielectric layer;

a second transmission line formed on the second dielectric layer; and a slit formed in the ground metal, wherein the substrate has a greater dielectric constant than the first dielectric layer, and the first transmission line and the second transmission line constitute the quarter-wavelength transmission lines of the divider.

In a ninth aspect of the present invention, there is provided an image rejection mixer which mixes a plurality of RF signals with local signals to output IF signals, the RF signals being obtained by dividing a received RF signal by a divider including two or more quarter-wavelength transmission lines with their one ends provided with the received RF signal and the other ends each outputting the plurality of RF signals, the divider comprising:

a substrate;

a first dielectric layer formed on the substrate;

a ground metal formed on the first dielectric layer;

a second dielectric layer formed on the ground metal;

a first transmission line formed between the substrate and the first dielectric layer;

a second transmission line formed on the second dielectric layer; and a slit formed in the ground metal, wherein the substrate has a greater dielectric constant than the first dielectric layer, and the first transmission line and the second transmission line constitute the quarter-wavelength transmission lines of the divider.

The present invention, on the one hand, reduces the capacitance between respective transmission lines and the ground metal using the slit formed in the ground metal, and on the other hand, reduces the coupling between the transmission lines, which is caused by the slit, by using the substrate with a large dielectric constant. Thus, the present invention is characterized in that it implements high impedance transmission lines by reducing the capacitance using the slit, and at the same time it achieves independence of the transmission lines by reducing the coupling between them.

This will be described in more detail. The second transmission line above the ground metal is formed on the surface of the dielectric layer with a low dielectric constant, whereas the first transmission line below the ground metal is disposed on the substrate with a large dielectric constant. Accordingly, most of the electric field caused by a current passing through the first transmission line concentrates onto the substrate, so that the electric coupling is very loose between the first and second transmission lines. As a result, the two transmission lines function as two independent transmission lines. In other words, the present invention enables a plurality of high impedance lines to be structured in a multilayer structure. Alternatively, when the characteristic impedance of the transmission lines are kept constant, a plurality of low-loss transmission lines can be implemented because the width of the conductors of the transmission lines can be made wider.

In addition, employing these transmission lines makes it possible to implement miniature, low-loss hybrids such as Wilkinson dividers. The above and other objects, effects, features and advantages of the present invention will become more apparent from the following description of the embodiments thereof taken in conjunction with the accompanying drawings.

BRIEF DESCRIPTION OF THE DRAWINGS

FIGS. 6A and 6B are graphs illustrating calculated results of the characteristics of the transmission lines of the Wilkinson divider as shown in FIG. 4A, wherein FIG. 6A illustrates the relationships between the slit width g and the characteristic impedance and loss of the transmission line (quarter-wavelength transmission line) 61, and FIG. 6B illustrates the relationships between the slit width g and the characteristic impedance and loss of the transmission line (quarter wavelength transmission line) 21;

FIGS. 8–10 are diagrams showing an embodiment of a two-stage Wilkinson divider employing the multilayer transmission line using a ground metal with a slit in accordance with the present invention, wherein FIG. 8 shows an equivalent circuit, FIG. 9 is a plan view, and FIG. 10 is a plan view with the upper layer transmission lines removed;

FIGS. 11–13 are diagrams showing an embodiment of a three output Wilkinson divider employing the multilayer transmission line using a ground metal with a slit in accordance with the present invention, wherein FIG. 11 shows an equivalent circuit, FIG. 12 is a plan view, and FIG. 13 is a plan view with the upper layer transmission line removed;

FIGS. 14–16 are diagrams showing an embodiment of a 90 degree branch-line hybrid employing the multilayer transmission line using a ground metal with a slit in accordance with the present invention, wherein FIG. 14 shows an equivalent circuit, FIG. 15 is a plan view, and FIG. 16 is a plan view with the upper layer transmission lines removed;

FIGS. 17–19 are diagrams showing an embodiment of a two-stage 90 degree branch-line hybrid employing the multilayer transmission line using a ground metal with a slit in accordance with the present invention, wherein FIG. 17 shows an equivalent circuit, FIG. 18 is a plan view, and FIG. 19 is a plan view with the upper layer transmission lines removed;

FIGS. 20–24 are diagrams showing an embodiment of a quasi-lumped 90 degree branch-line hybrid employing the multilayer transmission line using a ground metal with a slit in accordance with the present invention, wherein FIG. 20 shows an equivalent circuit, FIG. 21 is a perspective view, FIG. 22 is a cross-sectional view taken along the line 22—22 of FIG. 21, FIG. 23 is a plan view, and FIG. 24 is a plan view with the upper layer transmission lines removed;

FIGS. 26–28 are diagrams showing an embodiment of a two stage quasi-lumped 90 degree branch-line hybrid employing the multilayer transmission line using a ground metal with a slit in accordance with the present invention, wherein FIG. 26 shows an equivalent circuit, FIG. 27 is a plan view, and FIG. 28 is a plan view with the upper layer transmission lines removed;

FIGS. 29–31 are diagrams showing an embodiment of a 180 degree rat-race hybrid employing the multilayer transmission line using a ground metal with a slit in accordance with the present invention, wherein FIG. 29 shows an equivalent circuit, FIG. 30 is a plan view, and FIG. 31 is a plan view with the upper layer transmission lines removed;

FIGS. 33–35 are diagrams showing an embodiment of a quasi-lumped 180 degree rat-race hybrid employing the multilayer transmission line using a ground metal with a slit in accordance with the present invention, wherein FIG. 33 shows an equivalent circuit, FIG. 34 is a plan view, and FIG. 35 is a plan view with the upper layer transmission line removed;

FIGS. 36–39 are diagrams showing an embodiment of a reverse-phase hybrid ring employing the multilayer transmission line using a ground metal with a slit in accordance with the present invention, wherein FIG. 36 shows an equivalent circuit, FIG. 37 is a cross-sectional view, FIG. 38 is a plan view, and FIG. 39 is a plan view with the upper layer transmission line removed;

DETAILED DESCRIPTION OF THE PREFERRED EMBODIMENTS

The invention will now be described with reference to the accompanying drawings.

EMBODIMENT 1

Figure 1A:
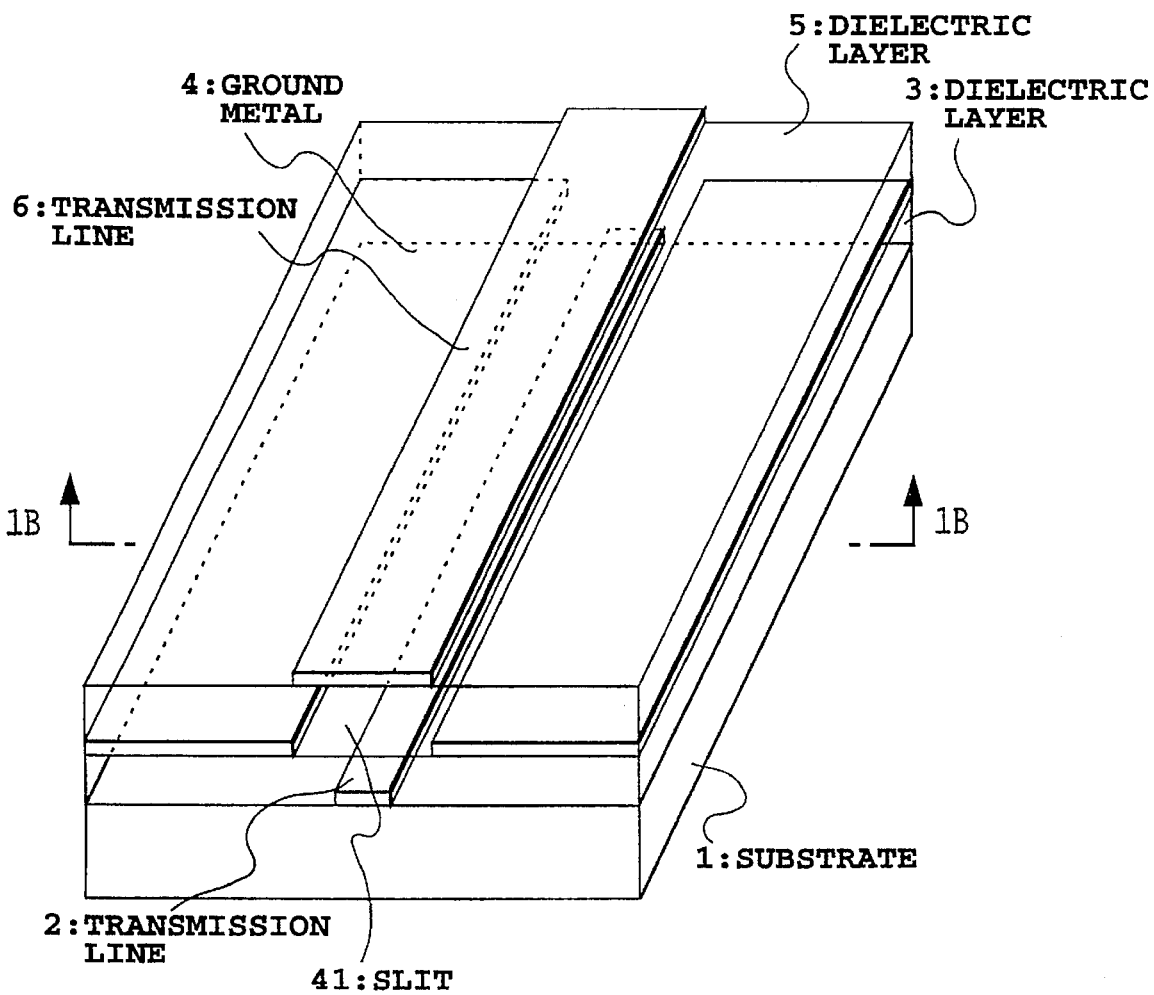
FIG. 1A is a perspective view showing a first embodiment of a multilayer transmission line using a ground metal with a slit in accordance with the present invention.
Figure 1B:
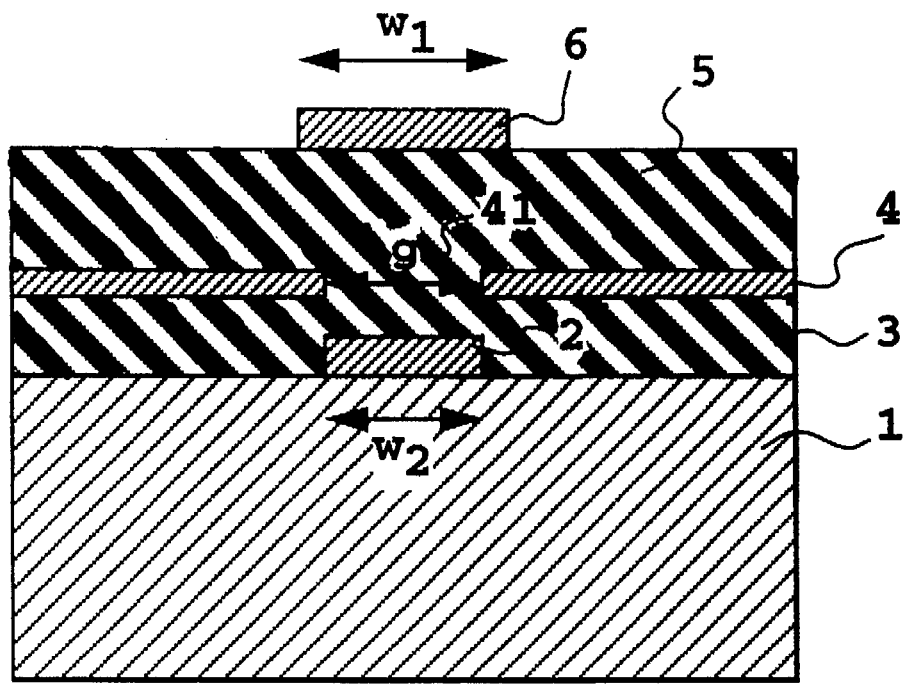
FIG. 1B is a cross-sectional view taken along the line 1B—1B of FIG. 1A.

FIG. 1A is a perspective view showing a first embodiment of a multilayer transmission line using a ground metal with a slit in accordance with the present invention, and FIG. 1B is a cross-sectional view taken along the line 1B—1B of FIG. 1A. In these figures, a lower transmission line 2 is formed in the center of the top surface of a substrate 1. A dielectric layer 3 is formed on the substrate 1 and the lower transmission line 2, and a ground metal 4 with a slit 41 is formed on the top surface of the dielectric layer 3. In addition, a dielectric layer 5 is formed on the ground metal 4, and an upper transmission line 6 is formed in the center of the top surface of the dielectric layer 5. Here, the slit 41 is formed at a position defined by projecting the lower and upper transmission lines 2 and 6 onto the ground metal 4. In other words, the center line of the lower transmission lines 2, that of the slit 41 and that of the upper transmission line 6 are all positioned in the same vertical plane. Their widths $w_2$, g and $w_1$, however, are usually differ from each other.

Semiconductors such as GaAs, or ceramics such as alumina are preferable as the substrate 1, and polymeric dielectrics such as polyimide are preferable as the dielectric layers 3 and 5. When a GaAs substrate with a dielectric constant of 12.6 is employed as the substrate 1, and a polyimide with a dielectric constant of 3.3 is used as the dielectric layers 3 and 5, the electric field generated by a current flowing through the lower transmission line 2 concentrates onto the substrate 1. As a result, the electric field reaching the upper transmission line 6 is very weak, and hence the two transmission lines 2 and 6 function as two independent transmission lines.

This will be described in more detail. Assuming that the characteristic impedances of the even and odd modes are represented by Ze and Zo, it is difficult to set the ratio Ze/Zo of the characteristic impedances at a large value. As a result, no tight coupling is established between the transmission lines 2 and 6. This is because the substrate 1 with a large dielectric constant increases the electric field in the substrate, and reduces the odd mode electric field between the transmission lines 2 and 6, resulting in a rather large Zo. In addition, since the phase velocities of the even and odd modes greatly differ, the transmission lines 2 and 6 do not function as a directional coupler. Furthermore, since the transmission lines differ greatly in effective dielectric constant, their practical lengths differ greatly (by a factor of about 1.5) when they are used as a quarter-wavelength transmission line. Thus, the coupling between the transmission lines can be kept loose.

Furthermore, the slit 41 formed in the ground metal 4 makes it possible to substantially reduce the capacitances of the transmission lines 2 and 6 with regard to the ground metal 4 (capacitance to ground) compared with the case where no slit is provided. Assuming that the characteristic impedance of a transmission line is Zo, its inductance is L, and its capacitance to ground is C, Zo is usually proportional to $(L/C)^{1/2}$. Therefore, setting the capacitance to ground small by using the slit allows the characteristic impedance to be increased if the line widths $w_1$ and $w_2$ are kept fixed (that is, when line inductances L are kept constant). Alternatively, it is possible to increase the line widths $w_1$ and $w_2$ while keeping the characteristic impedances constant, in which case the transmission losses can be reduced. This is because the transmission loss of the line is proportional to the sum total of R/Zo, where R is the resistance per unit length of the transmission line.

Figure 2:
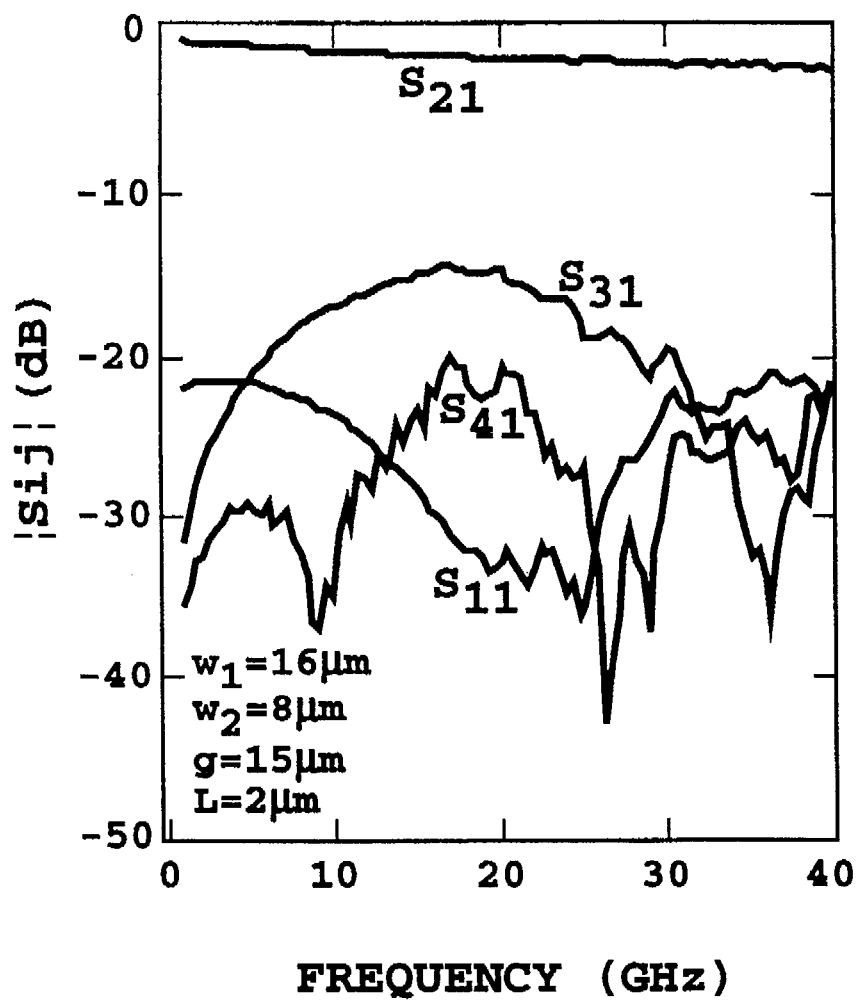
FIG. 2 is a graph illustrating measured results of the coupling characteristics of the transmission lines 2 and 6 associated with the first embodiment.

FIG. 2 is a graph illustrating results of measurement of the coupling characteristics of the transmission lines 2 and 6. The materials of the semiconductor substrate 1 and the dielectric layers 3 and 5 were GaAs with a dielectric constant of 12.6 and a polyimide with a dielectric constant of 3.3, respectively. In addition, the lower transmission line 2 had a width $w_2$=8 μm, and the upper transmission line 6 had a width $w_1$=16 μm, their length L=2 mm, the slit 41 had a width g=15 μm, and the dielectric layers 3 and 5 had a thickness h =5 μm.

According to the measurement results, $S_{31}$ representing the coupling characteristics of the two transmission lines 2 and 6 is below −15 dB, and $S_{41}$ representing the isolation characteristics is below 20 dB. These values show that the two transmission lines 2 and 6 do not function as coupled lines, but operate as two separate transmission lines.

Thus, in this embodiment, the characteristic impedances are increased by forming the slit 41 in the ground metal 4, thereby decreasing the capacitance to ground. At the same time, the coupling between the transmission lines 2 and 6 caused by the slit 41 is kept loose by using the substrate 1 with a large dielectric constant. This makes it possible to implement low-loss transmission lines.

EMBODIMENT 2

Figure 3A:
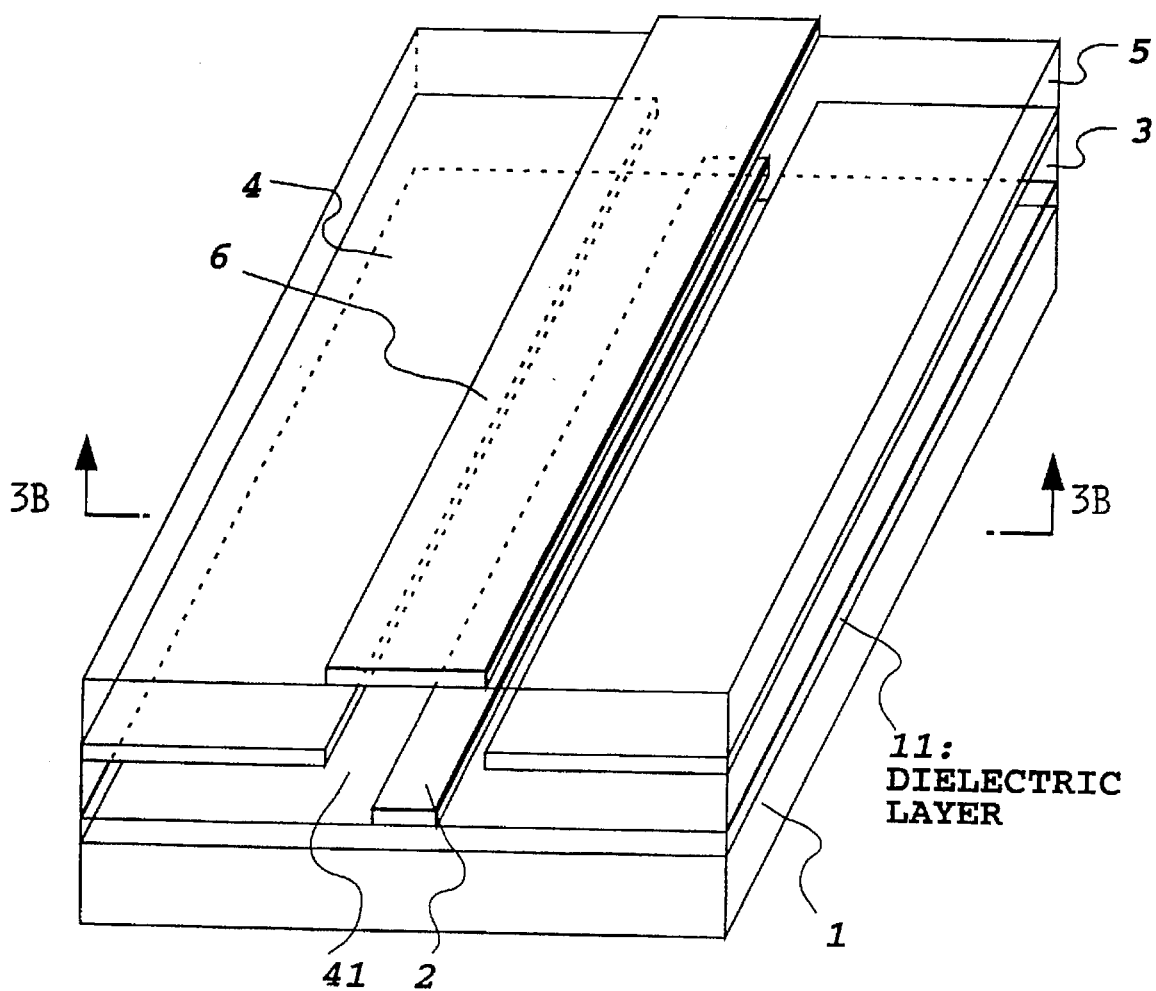
FIG. 3A is a perspective view showing a second embodiment of a multilayer transmission line using a ground metal with a slit in accordance with the present invention.
Figure 3B:
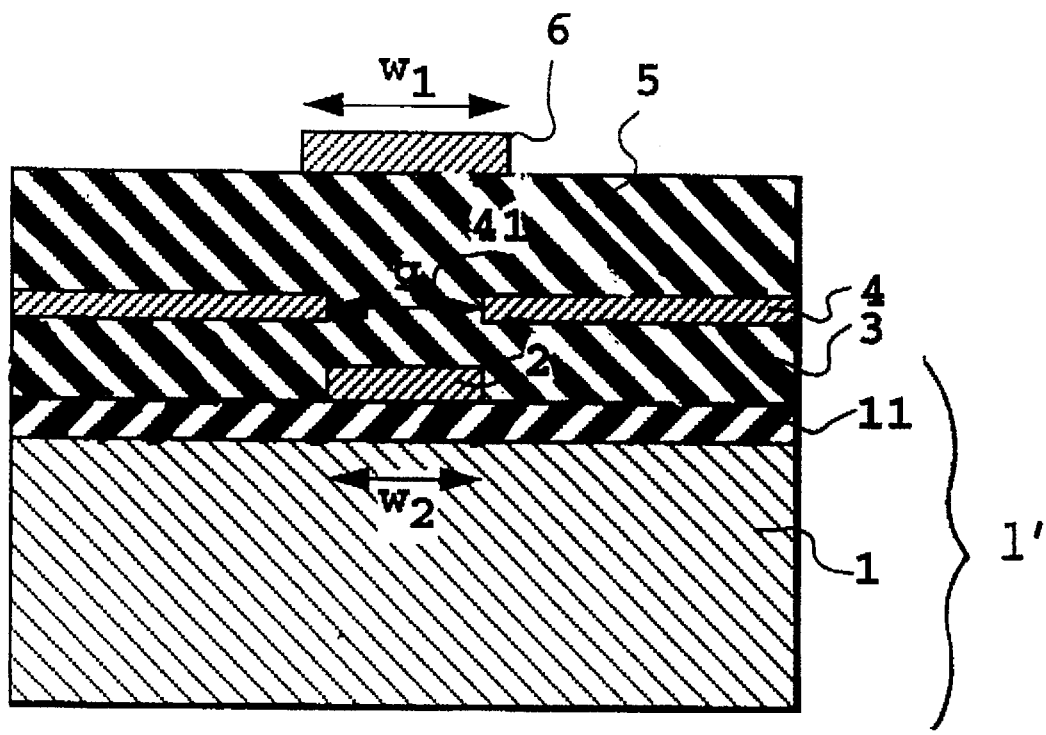
FIG. 3B is a cross-sectional view taken along the line 3B—3B of FIG. 3A.

FIG. 3A is a perspective view showing a second embodiment of a multilayer transmission line using a ground metal with a slit in accordance with the present invention, and FIG. 3B is a cross-sectional view taken along the line 3B—3B of FIG. 3A.

The second embodiment differs from the first embodiment in that a dielectric layer 11 is formed on the substrate 1 to form a new substrate 1', and the lower transmission line 2 is formed in the center of the top surface of the substrate 1'. Thus, the dielectric layer 11 together with the substrate 1 is considered to constitute the substrate 1' in the present invention. According to this embodiment, the dielectric constant of the dielectric layers 3 and 5 can be varied from that of the dielectric layer 11. For example, the dielectric layers 3 and 5 are made from polyimide with a dielectric constant of 3.3, and the dielectric layer 11 is made from tantalum oxide ($Ta_2O_5$) with a dielectric constant of 25. By thus stacking different types of dielectric layers, the present invention can be implemented independently of the dielectric constant of the substrate 1. This makes possible to increase the degree of freedom for circuit configuration. ps EMBODIMENT 3

Figure 4A:
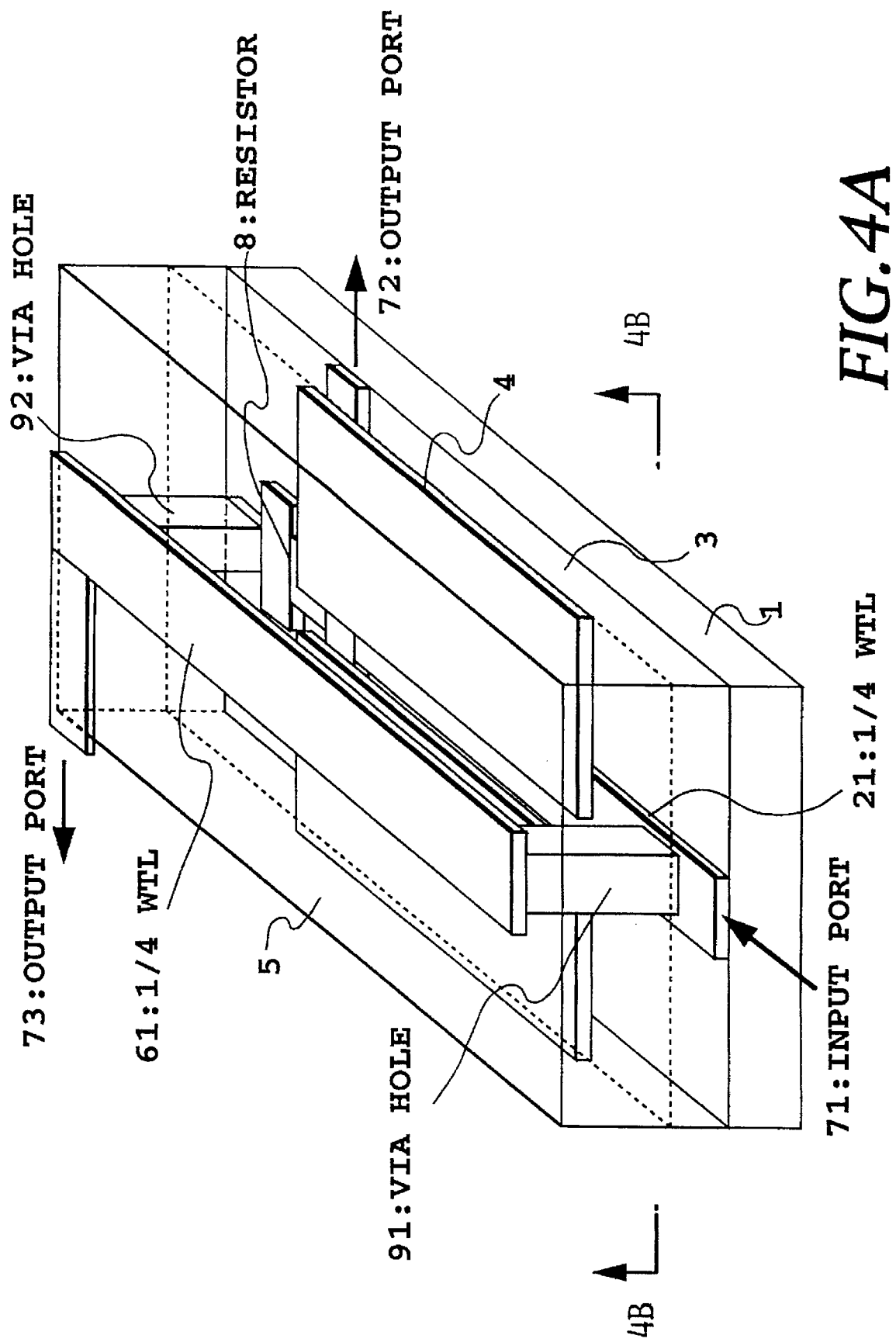
FIG. 4A is a perspective view showing an embodiment of a Wilkinson divider employing the multilayer transmission line using a ground metal with a slit in accordance with the present invention.
Figure 4B:
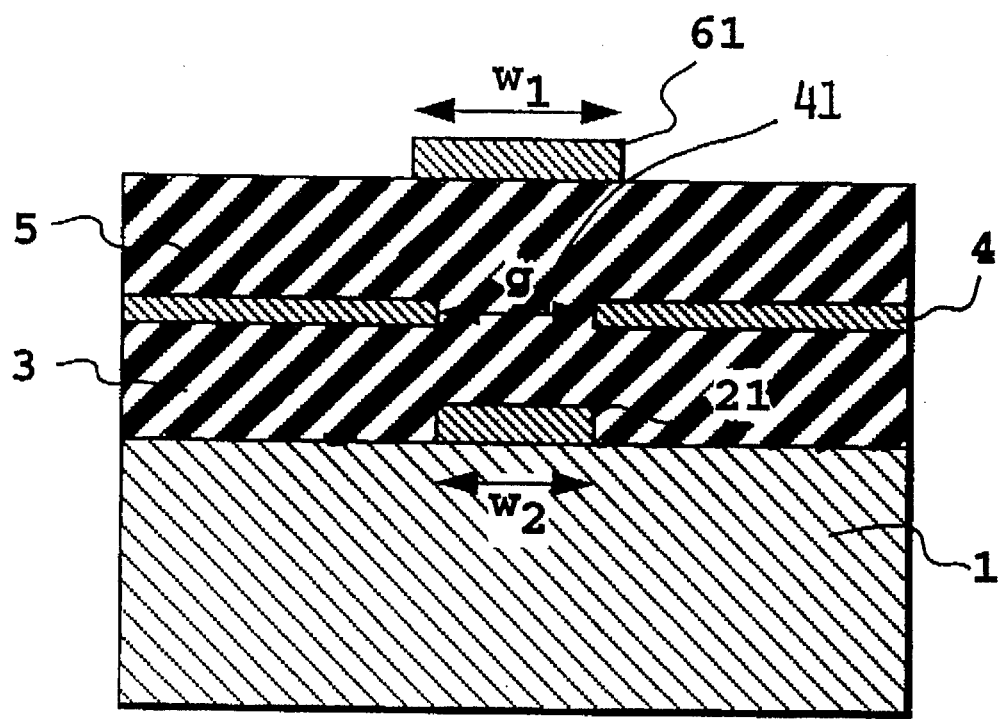
FIG. 4B is a cross-sectional view taken along the line 4B—4B of FIG. 4A.

FIG. 4A is a perspective view showing an embodiment of a Wilkinson divider employing the multilayer transmission line using a ground metal with a slit in accordance with the present invention, and FIG. 4B is a cross-sectional view taken along the line 4B—4B of FIG. 4A.

In this figure, a quarter-wavelength transmission line 21 is formed in the center of the top surface of the semiconductor substrate 1, and one end thereof is connected to an input port 71. The other end thereof is led to the right-hand side of the semiconductor substrate 1, and is connected to an output port 72. On the other hand, another quarter-wavelength transmission line 61 is formed in the center of the top surface of the dielectric layer 5 in such a manner that it faces the quarter-wavelength transmission line 21, and one end thereof is connected to the input port through a via hole 91. The other end thereof is led to the left-hand side of the dielectric layer 5, and is connected to an output port 73. As is clearly shown in this figure, the quarter-wavelength transmission line 61 is longer than the quarter wavelength transmission line 21. This is because the dielectric constant of the dielectric layer 5 is smaller than that of the semiconductor substrate 1 as described before.

A resistor 8 is formed on top of the semiconductor substrate 1. Its one end is connected to the other end of the quarter-wavelength transmission line 21, and the other end of the resistor 8 is connected to the other end of the quarter-wavelength transmission line 61 through a via hole 92. The resistor 8 is provided for balancing the outputs.

A slit 41 is formed in the center of the ground metal 4. The slit 41 is formed at a position defined when the quarter-wavelength transmission lines 21 and 61 are projected onto the ground metal 4. In other words, the center lines of the elements 21, 61 and 41 fall on the same plane.

Figure 5:
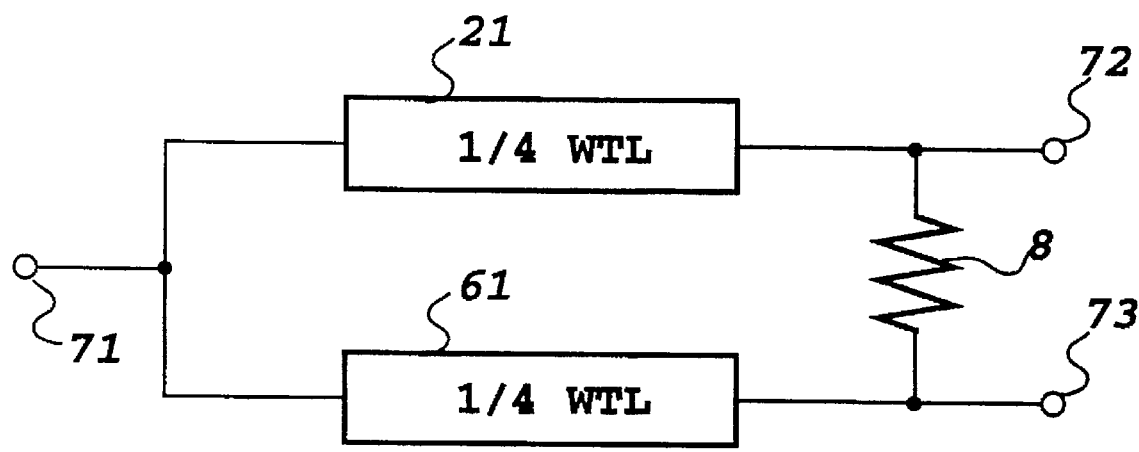
FIG. 5 is an equivalent circuit of the Wilkinson divider shown in FIG. 4A.

FIG. 5 is an equivalent circuit of the Wilkinson divider. A microwave entering the input port 71 is equally divided into two parts, so that the microwaves of the same phase and amplitude are produced from the output ports 72 and 73.

Figure 6A:
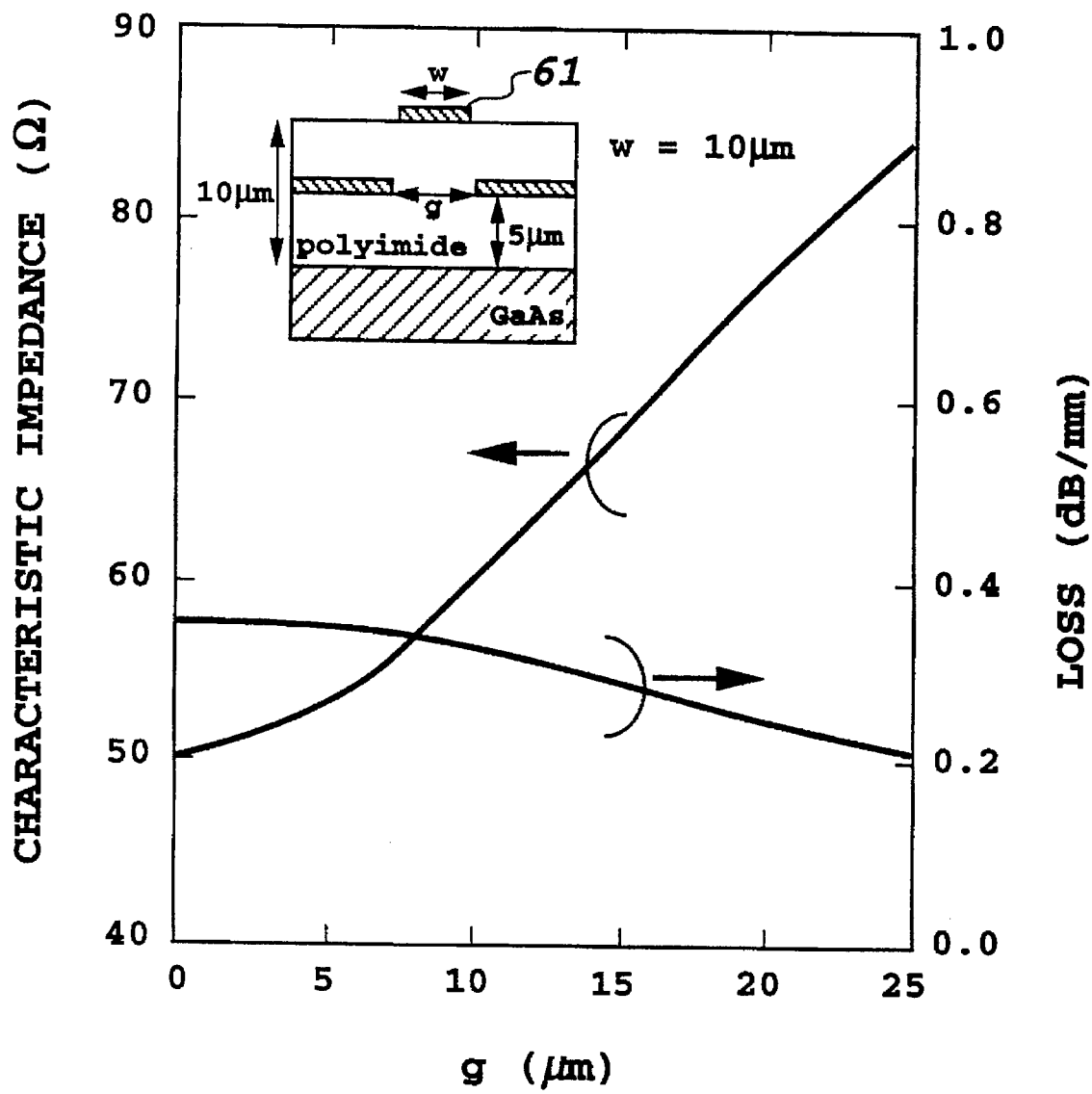
Figure 6B:
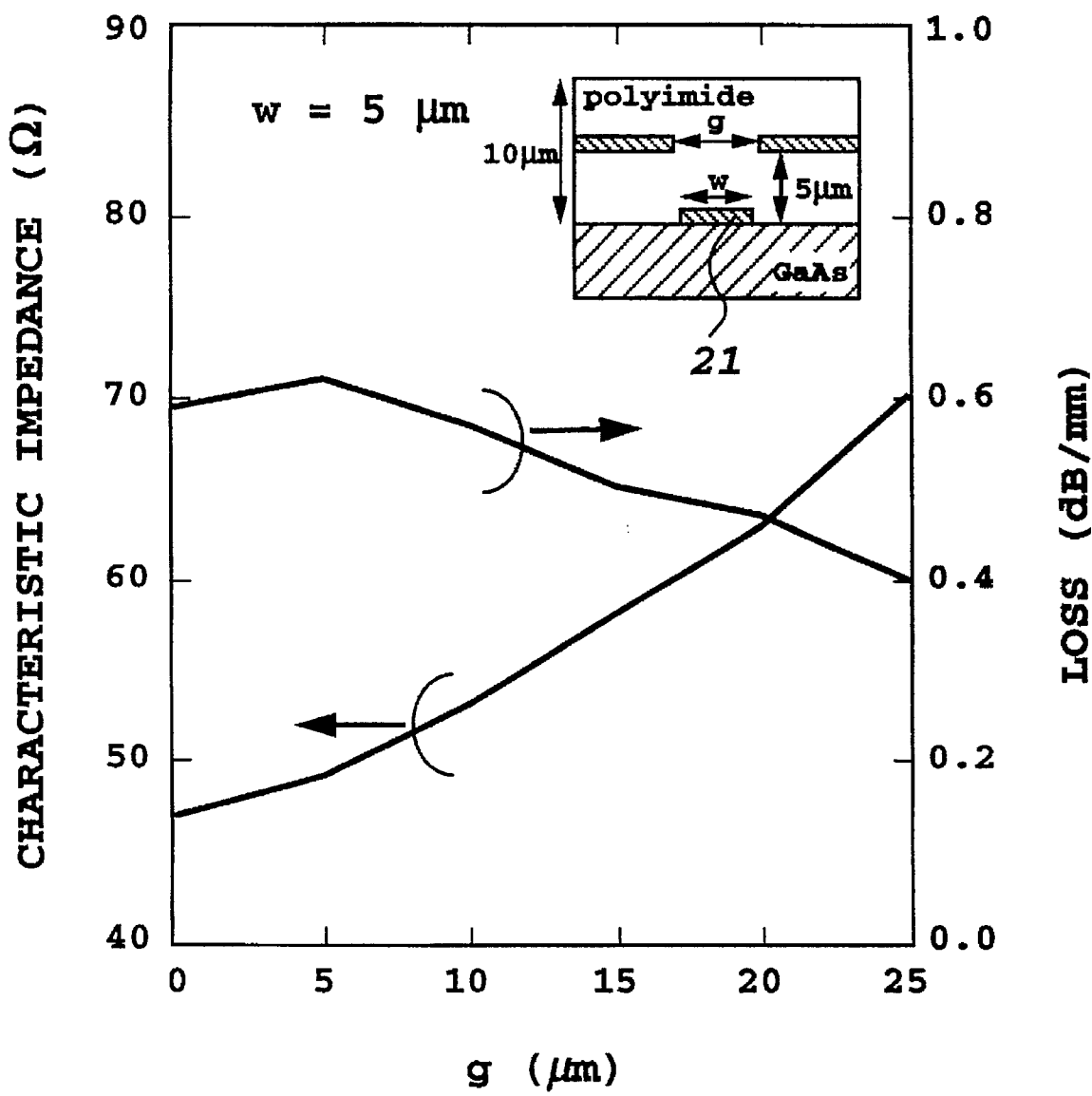

FIGS. 6A and 6B are graphs illustrating calculation results of the characteristics of the transmission lines of the Wilkinson divider in accordance with this embodiment. FIG. 6A illustrates the relationships between the slit width g, and the characteristic impedance and the loss of the transmission line 61, and FIG. 6B illustrates the relationships between the slit width g, and the characteristic impedance and the loss of the transmission line 21. The calculation was carried out by the finite element method under the following conditions. The material of the semiconductor substrate 1 was GaAs, and that of the dielectric layers 3 and 5 was polyimide. The transmission line 61 had a width of $w_1=10$ µm, the transmission line 21 had a width of $w_2=5$ µm, and the dielectric layers 3 and 5 had a thickness of $h_1=h_2=5$ µm.

The calculation results show that the characteristic impedance increases and the line loss decreases in either case of the transmission lines 61 and 21 as the width g of the slit 41 in the ground metal 4 increases.

In a conventional Wilkinson divider, the width w of the quarter wavelength transmission line ranges from several hundred µm to beyond a few mm, and the distance h between the ground metal and the quarter wavelength transmission line is from 100 µm to about 1 mm. Considering these facts, the Wilkinson divider of this embodiment can be greatly miniaturized, and a high impedance and low loss transmission lines can be easily implemented.

The actual lengths of the quarter-wavelength transmission lines 21 and 61 were calculated by the finite element method under the conditions that the characteristic impedance of the Wilkinson divider was 70 ohms, the width g of the slit 41 was $g=25$ µm. With the quarter-wavelength transmission lines 61 formed above the ground plane 4, the actual length at 20 GHz was 2.3 mm when the line width $w_1=13$ µm, and the effective dielectric constant $e_{eff}=2.9$. With the quarter-wavelength transmission lines 21 formed below the ground plane 4, the actual length at 20 GHz was 1.4 mm when the line width $w_2=5$ µm, and the effective dielectric constant $e_{eff}=7.6$.

Figure 7:
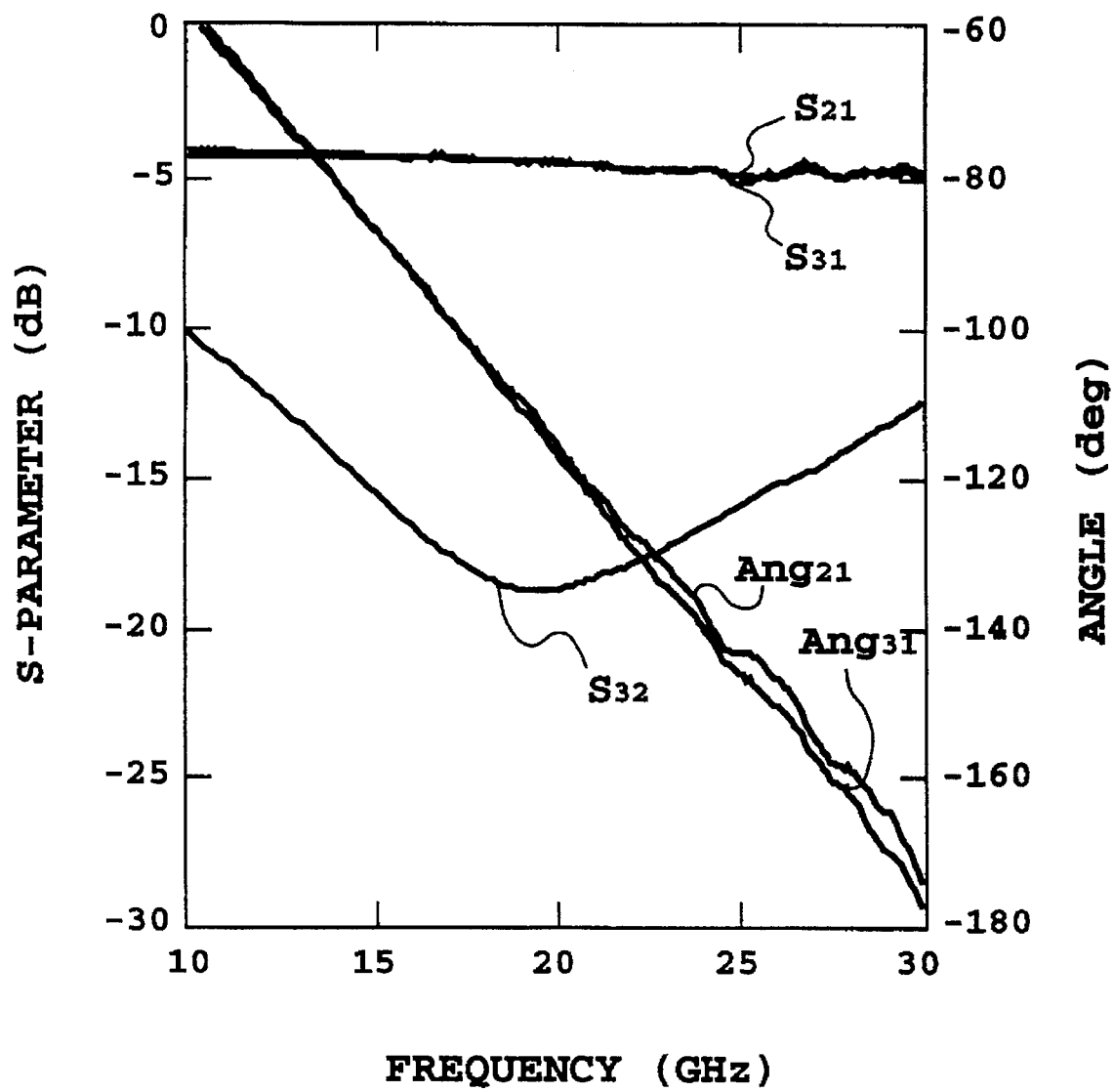
FIG. 7 is a graph illustrating measured results of circuit characteristics of the Wilkinson divider as shown in FIG. 4A.

FIG. 7 shows calculation results of circuit characteristics of the Wilkinson divider fabricated in the above-mentioned dimensions. The passing characteristics $S_{21}$ and $S_{31}$ from the input port 71 to the two output ports 72 and 73 were nearly equal, and the phase angles $Ang_{21}$ and $Ang_{31}$ were also nearly equal. The isolation $S_{32}$ between the two output ports 72 and 73 was beyond $-15$ dB. These results show that this embodiment functions as a Wilkinson divider.

EMBODIMENT 4

Figure 8:
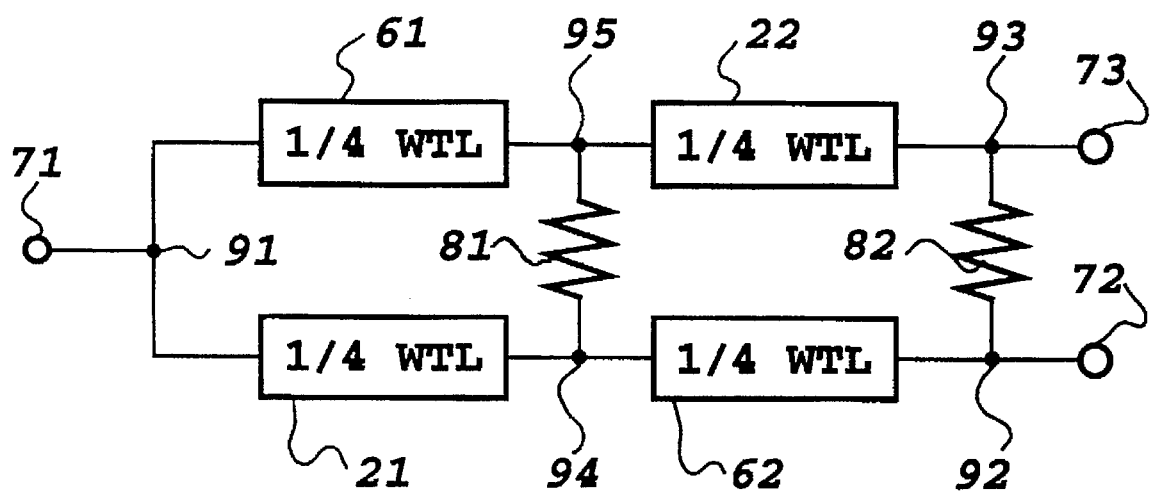
Figure 9:
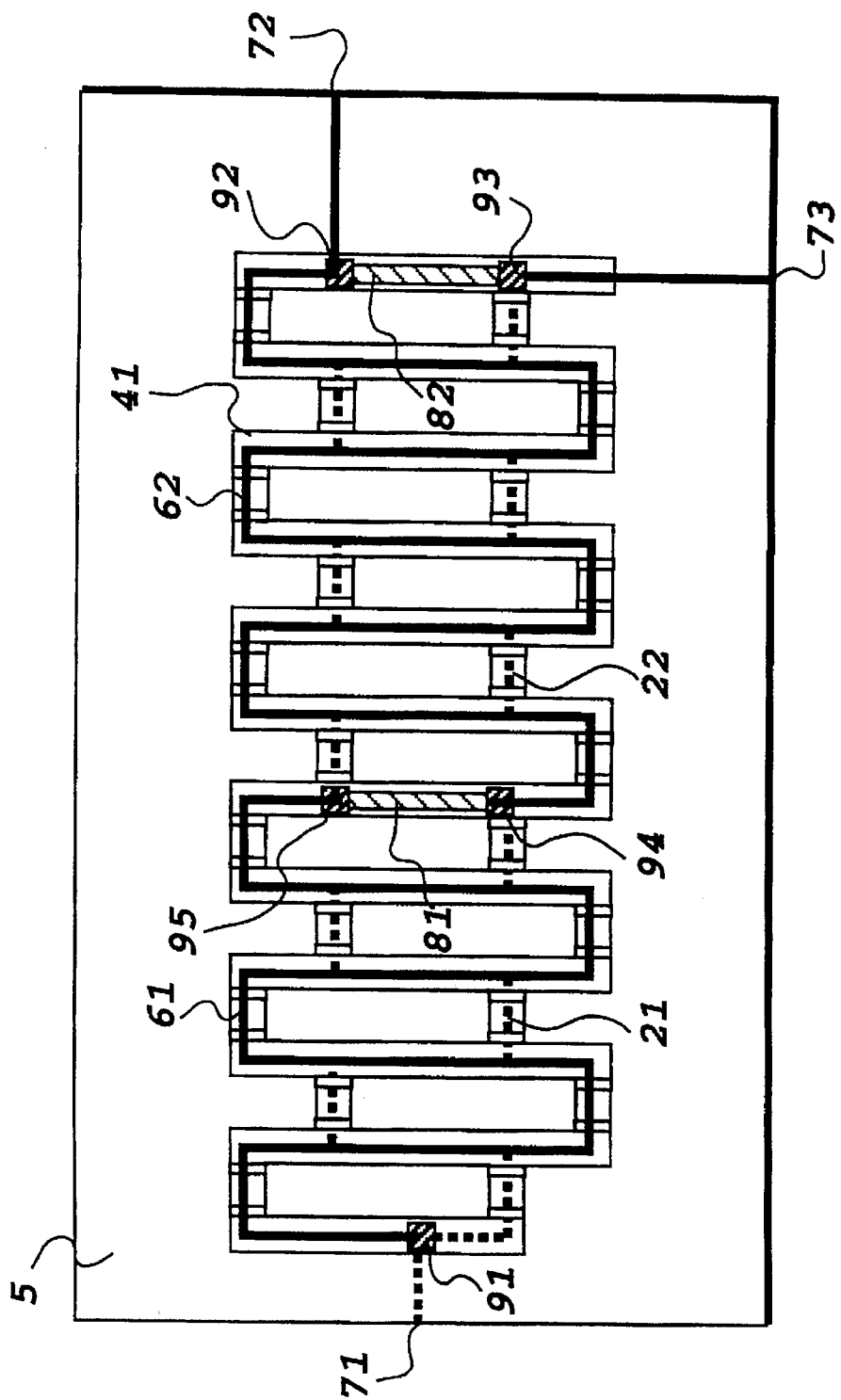
Figure 10:
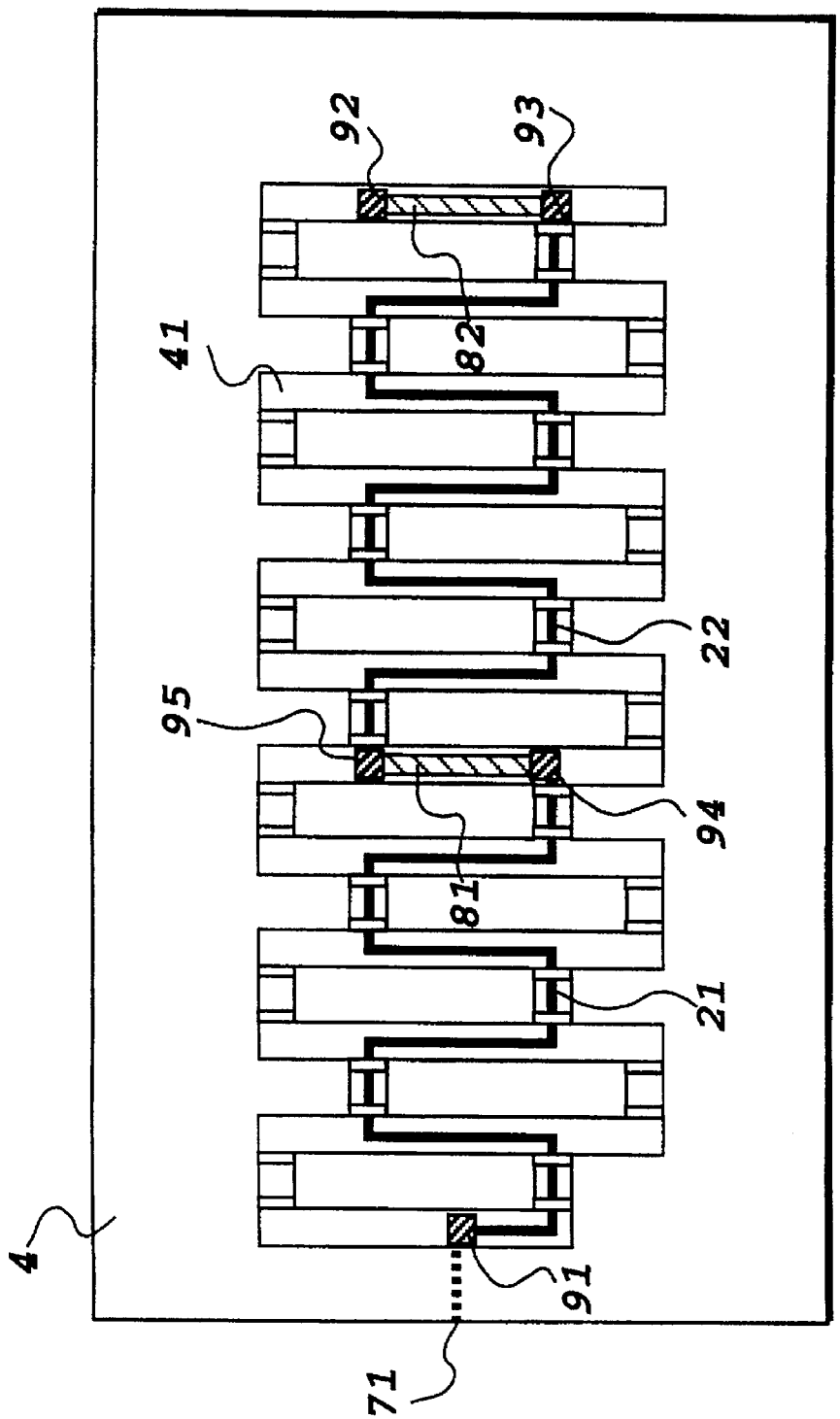

FIGS. 8–10 are diagrams showing an embodiment of a two-stage Wilkinson divider employing the multilayer transmission line using a ground plane with a slit in accordance with the present invention, wherein FIG. 8 is an equivalent circuit, FIG. 9 is a plan view, and FIG. 10 is a plan view with the upper transmission lines removed.

This embodiment comprises two Wilkinson dividers connected in cascade as shown in FIG. 8. First, on the top surface of the dielectric layer 5 shown in FIG. 9, two meander-like quarter-wavelength transmission lines 61 and 62 are formed, and are connected in series with a resistor 81 formed below through via holes 94 and 95. The end of the quarter-wavelength transmission line 61 is connected to the input port 71 formed below through the via hole 91, and the end of the quarter-wavelength transmission line 62 is connected to the output port 72 and one end of the resistor 82 formed below through the via hole 92. The other end of the resistor 82 is connected to the output port 73 formed above through a via hole 93.

On the other hand, on top of the semiconductor substrate 1, two meander-like quarter-wavelength transmission lines 21 and 22 are formed which are connected in series through a resistor 81 as shown in FIG. 10. The end of the quarter-wavelength transmission line 21 is connected to the input port 71. The end of the quarter-wavelength transmission line 22 is connected to the output port 73 on the upper layer through the via hole 93, and to the output port 72 on the upper layer through the resistor 82 and the via hole 92.

Furthermore, a meander-like slit 41 is formed in the ground metal 4 at positions defined by projecting the quarter-wavelength transmission lines 21, 22, 61 and 62 onto the ground metal. Thus, a Wilkinson divider as shown in FIG. 8 is implemented.

The actual length of the lower quarter-wavelength transmission lines 21 and 22 is shorter than that of the upper quarter-wavelength transmission lines 61 and 62 because of the difference between the dielectric constants of the semiconductor substrate 1 and the dielectric layer 5.

According to the present embodiment, a microwave signal entering the input port 71 is emitted from the output ports 72 and 73 in such a manner that its phase is inverted and its power is halved.

EMBODIMENT 5

Figure 11:
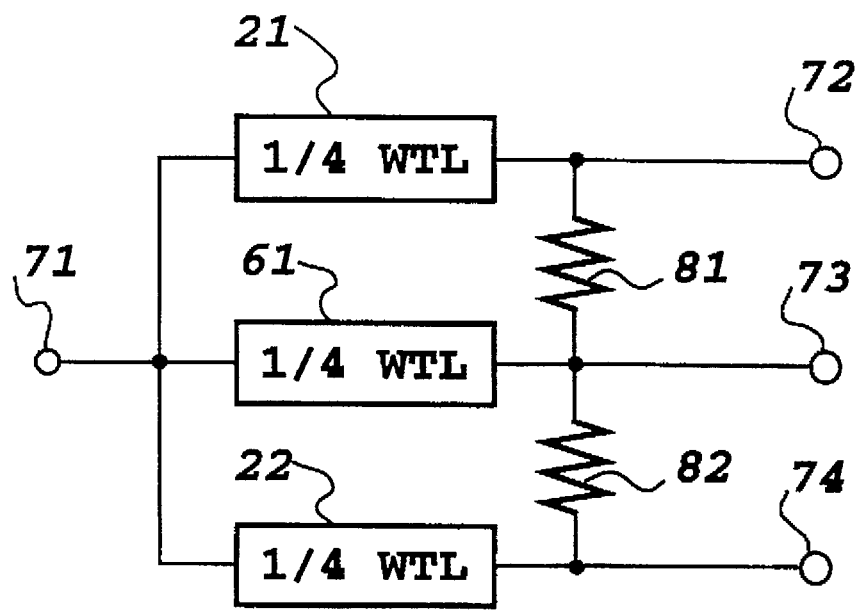
Figure 12:
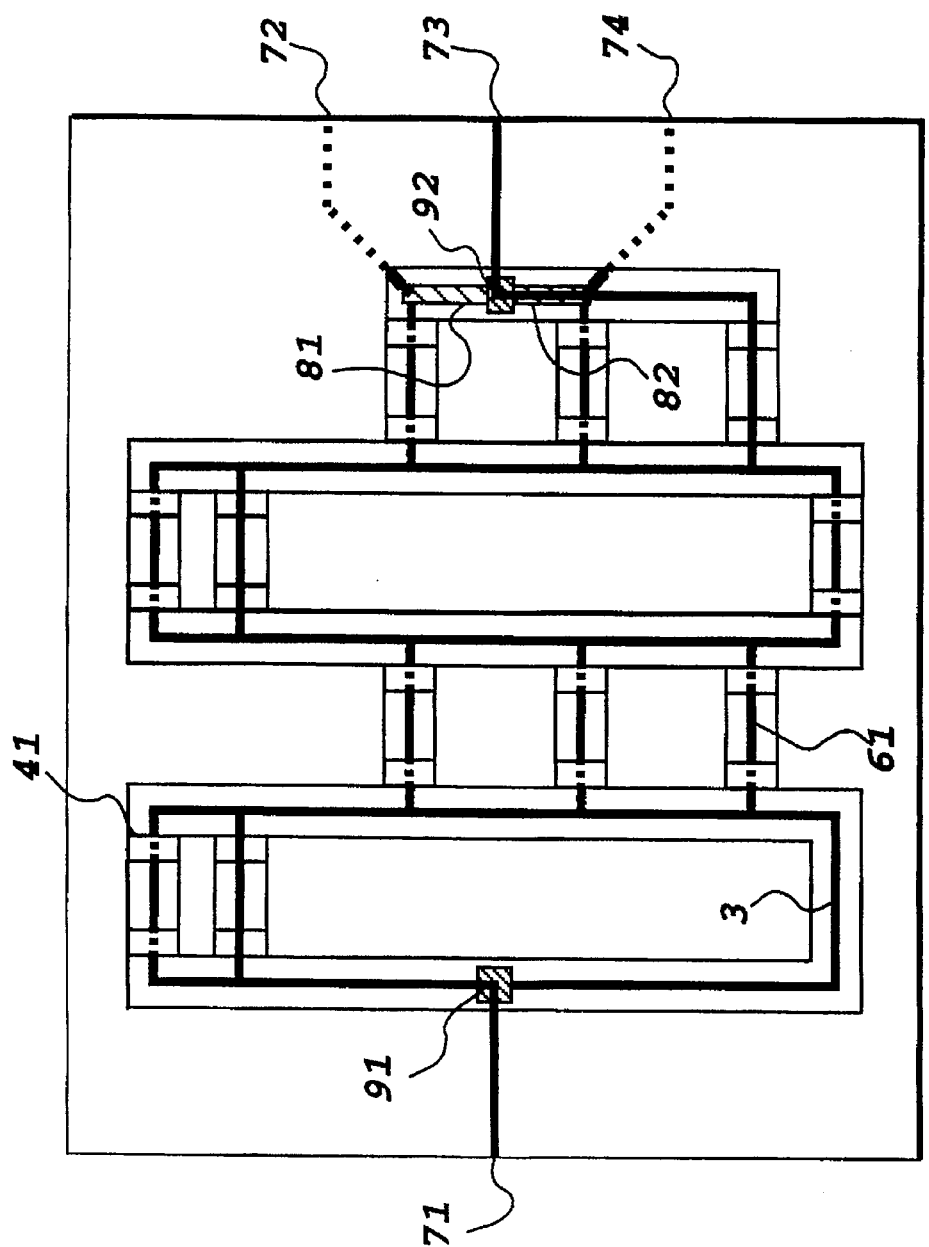
Figure 13:
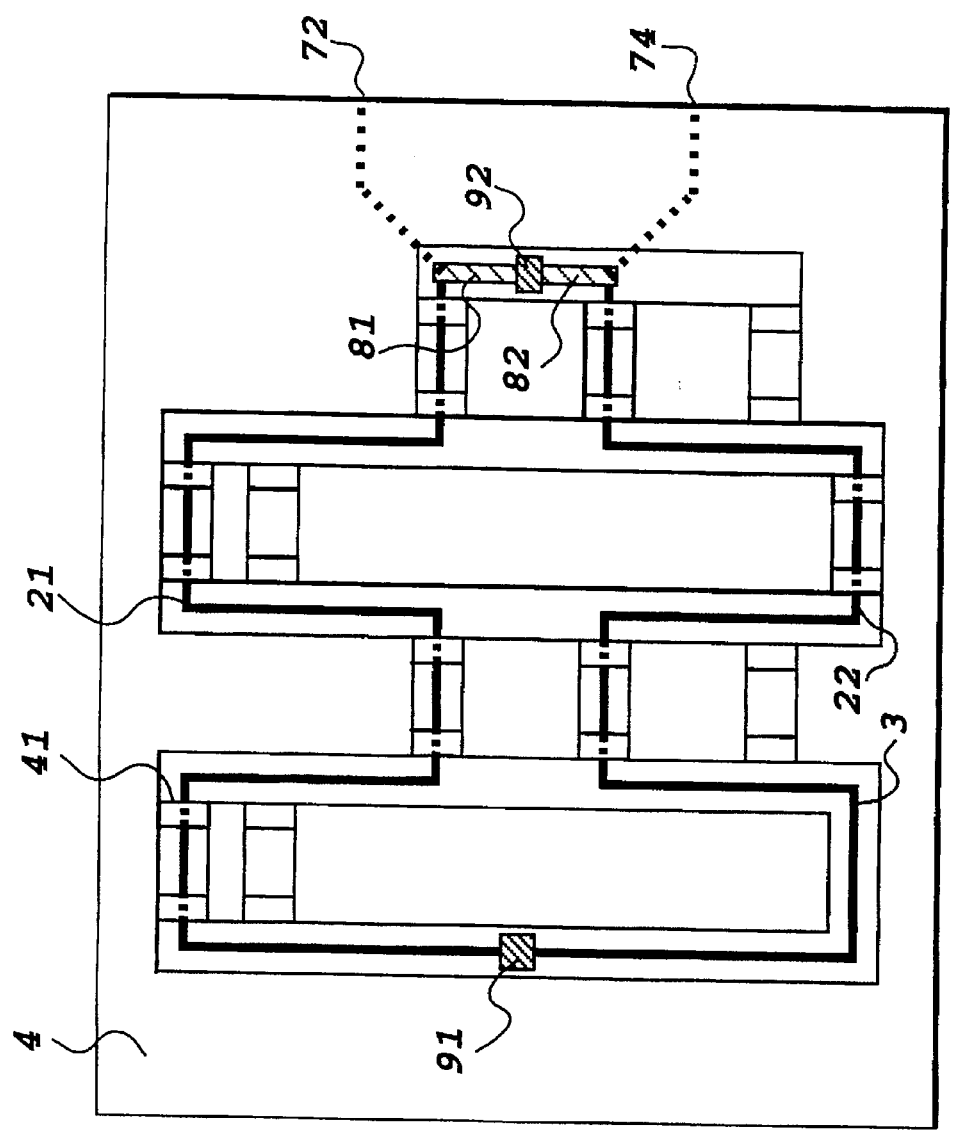

FIGS. 11–13 are diagrams showing an embodiment of a three output Wilkinson divider employing the multilayer transmission line using a ground plane with a slit in accordance with the present invention, wherein FIG. 11 is an equivalent circuit, FIG. 12 is a plan view, and FIG. 13 is a plan view with the upper transmission line removed.

In these figures, two meander-like quarter-wavelength transmission lines 21 and 22 are formed on the semiconductor substrate 1, with their one ends connected to the upper input port 71 through the via hole 91. The other ends of the quarter-wavelength transmission lines 21 and 22 are connected to the output ports 72 and 74, and to the via hole 92 through the resistors 81 and 82, respectively.

On the other hand, one meander-like quarter-wavelength transmission line 61 is formed on the upper dielectric layer 5 with its one end connected to the input port 71, and the other end connected to the output port 73. The output port 73 is also connected to the resistors 81 and 82 through the via hole 92.

In addition, the slit 41 is formed on the ground metal 4 at positions defined by projecting the quarter-wavelength transmission lines 21, 22, 61 and 62 onto the ground metal 4. Thus, a three output Wilkinson divider is implemented as shown in FIG. 11.

EMBODIMENT 6

Figure 14:
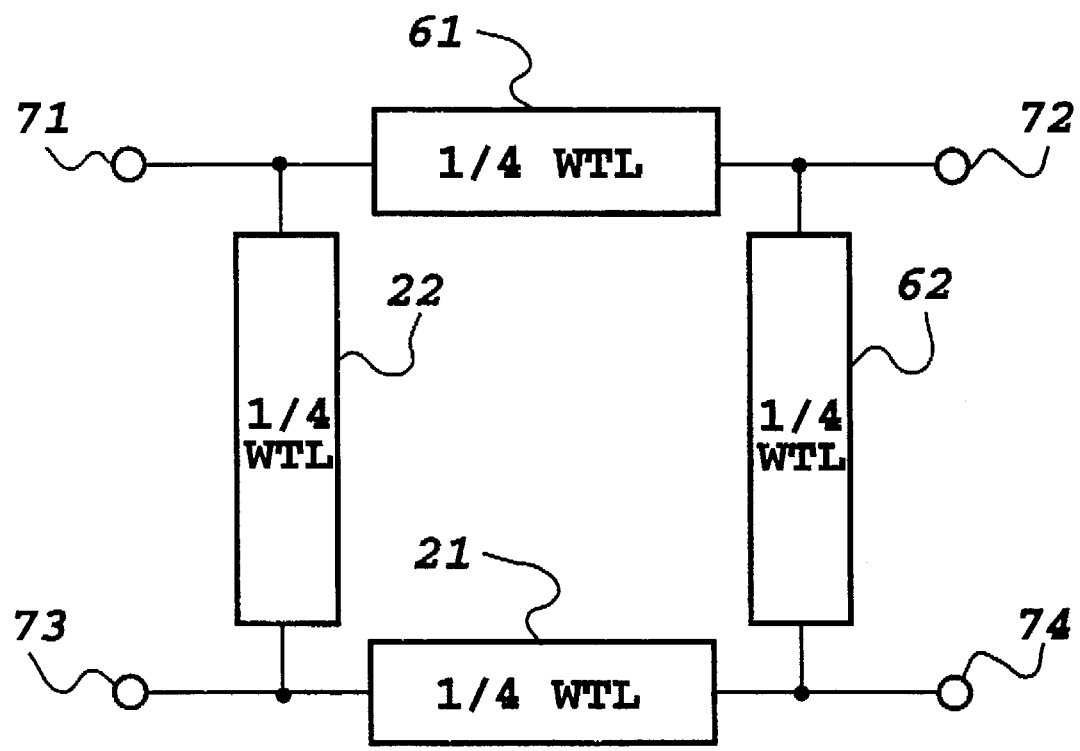
Figure 15:
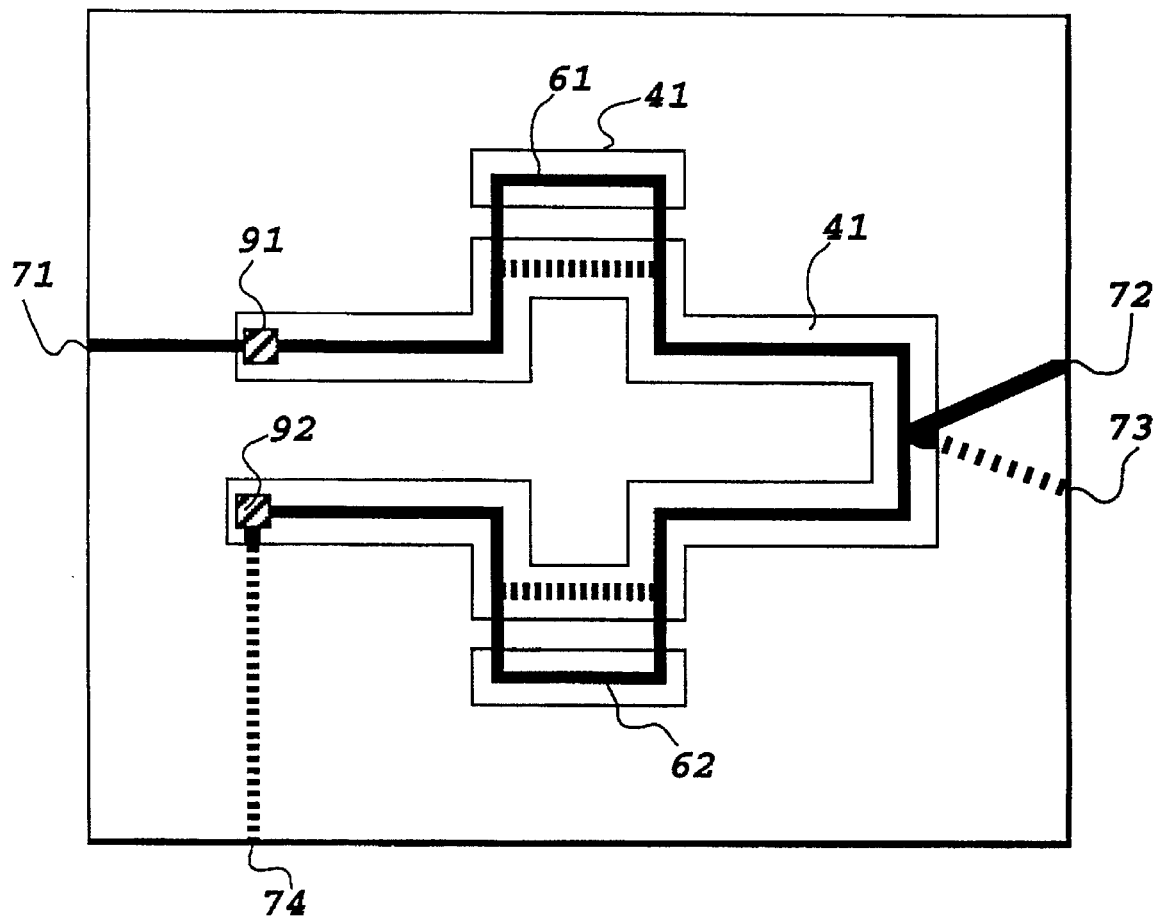
Figure 16:
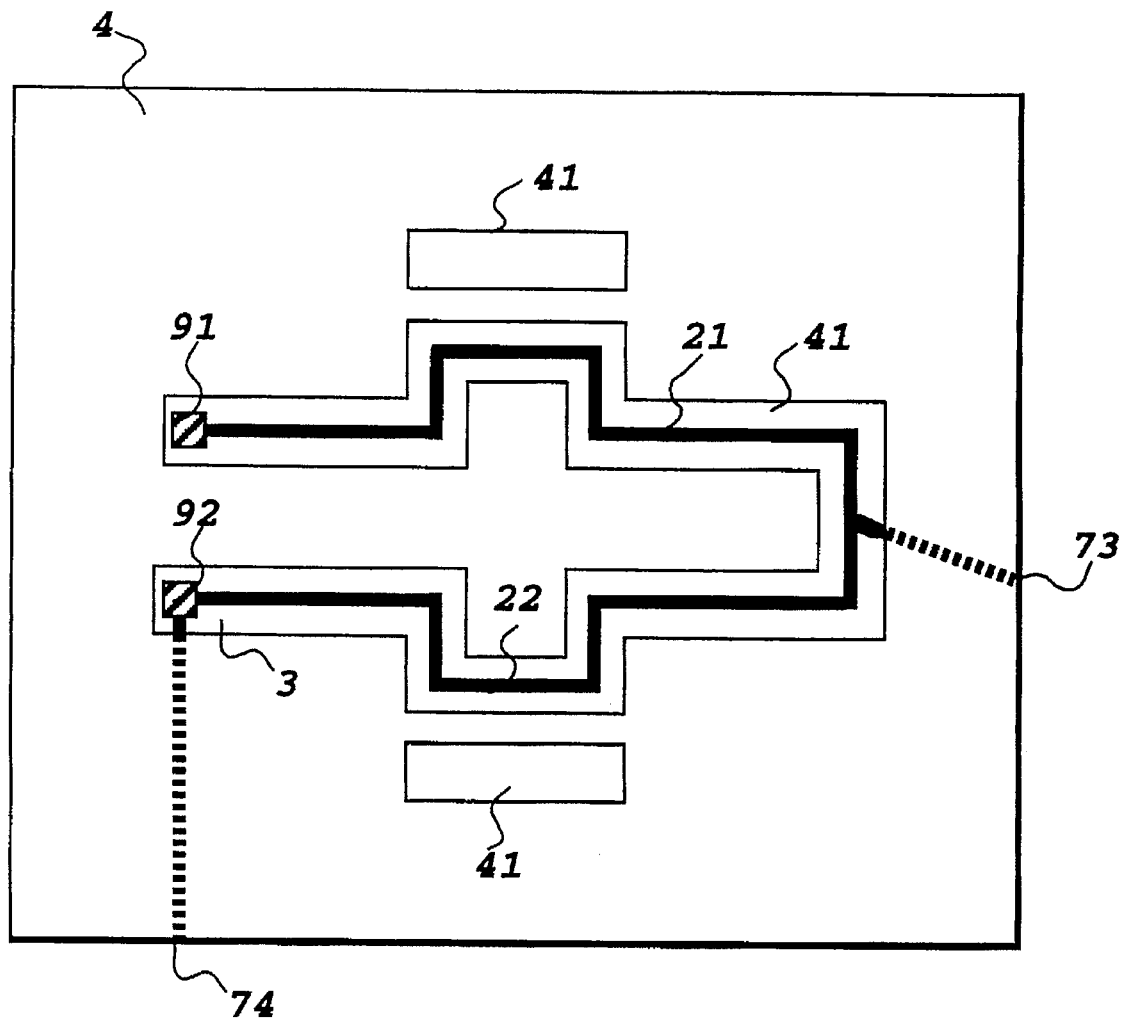

FIGS. 14–16 are diagrams showing an embodiment of a 90 degree branch-line hybrid employing the multilayer transmission line using a ground plane with a slit in accordance with the present invention. This embodiment comprises two quarter-wavelength transmission lines 21 and 22 formed on the semiconductor substrate 1 and two quarter-wavelength transmission lines 61 and 62 formed on the upper dielectric layer 5, which are connected in a loop fashion through via holes 91 and 92. Slits 41 are formed in the ground metal 4 at positions defined by projecting these quarter-wavelength transmission lines onto the ground metal 4. Since the structure of this embodiment is clear from these figures, the detail description thereof is omitted here.

In the 90 degree branch-line hybrid, a microwave signal input to the port 71 is output from the port 74 with its phase inverted, and from the port 72 with its phase retarded by 90 degrees. From the port 73, no signal is output.

EMBODIMENT 7

Figure 17:
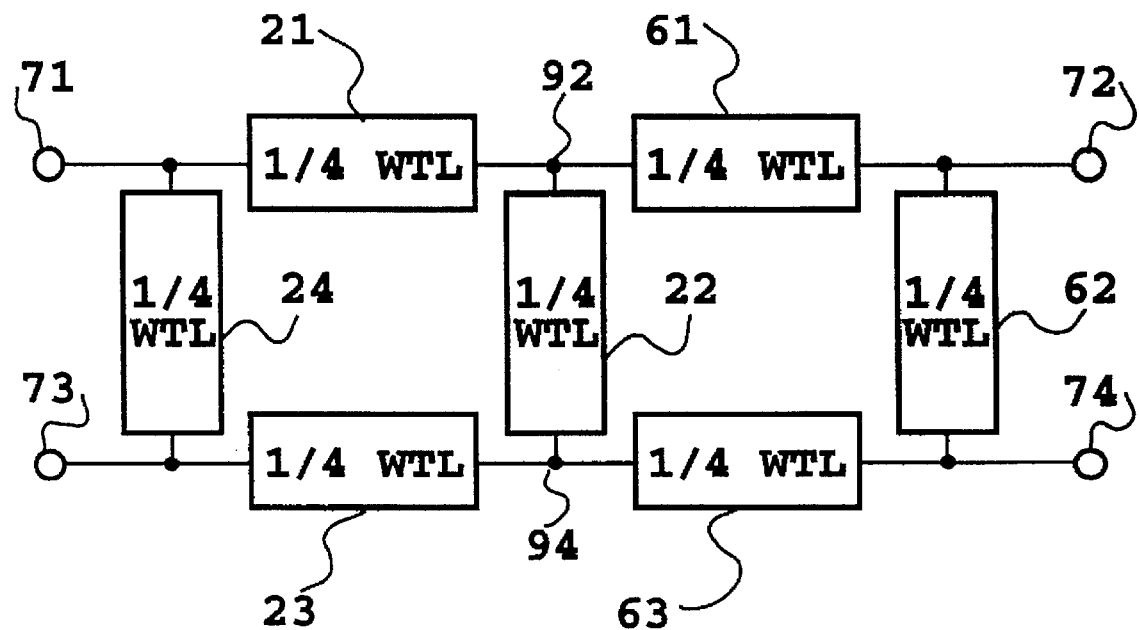
Figure 18:
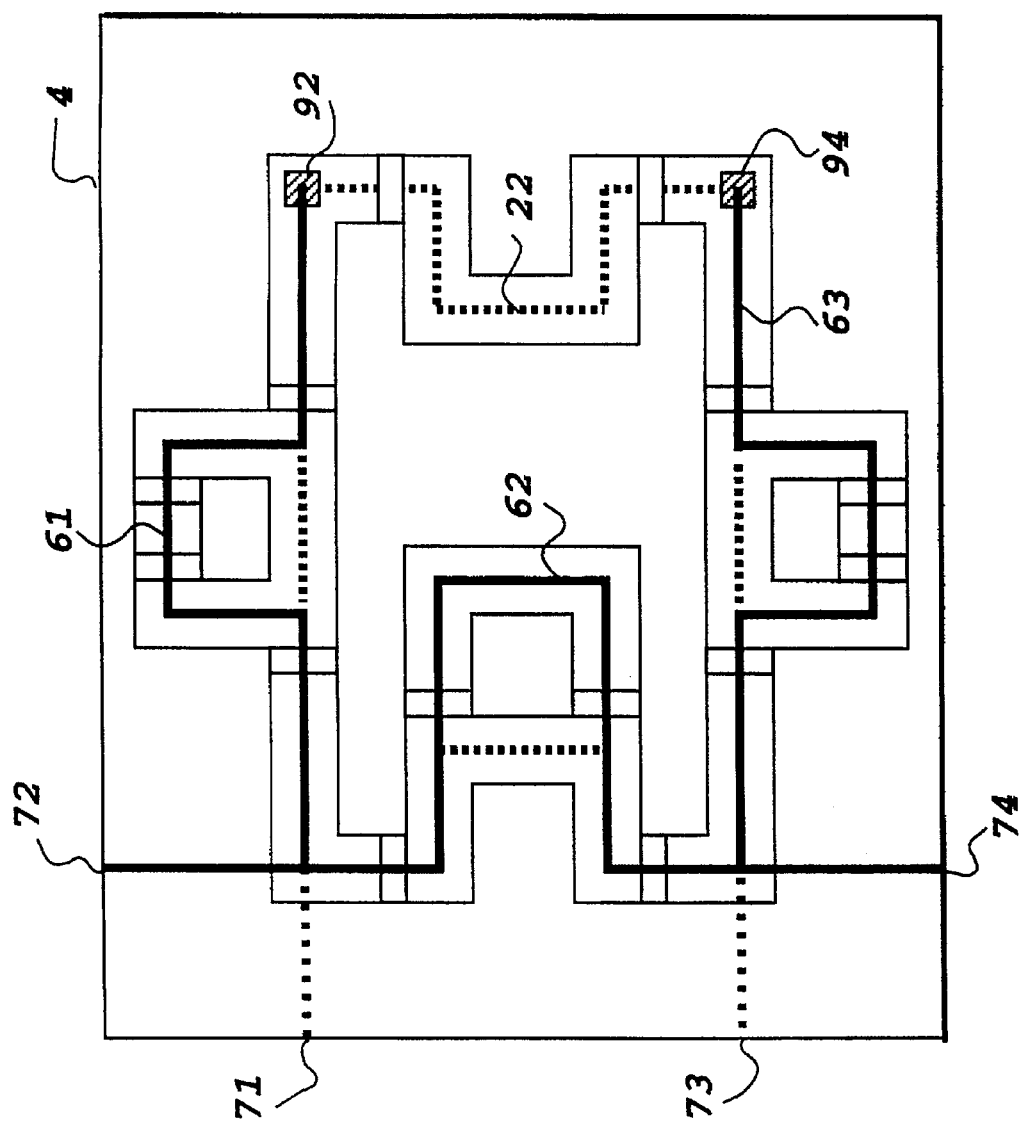
Figure 19:
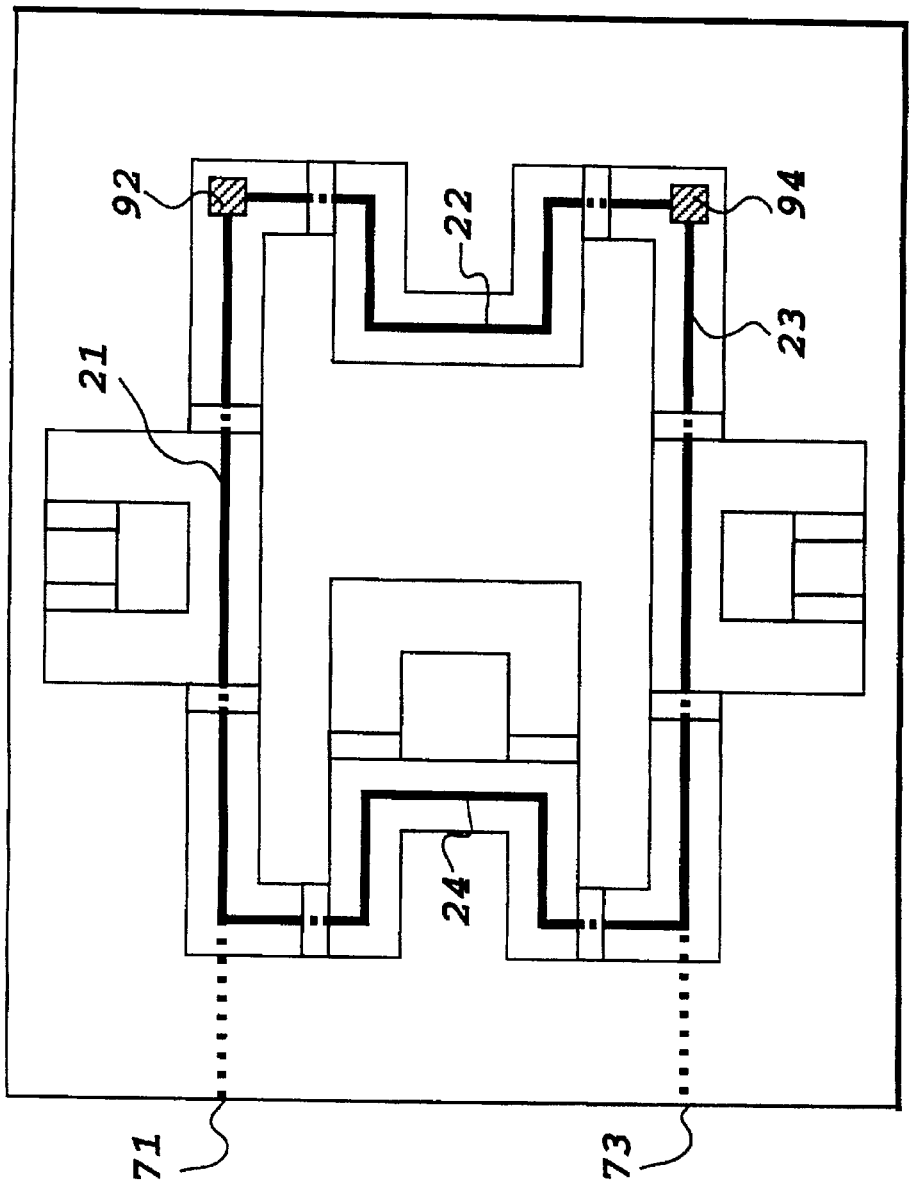
Figure 20:
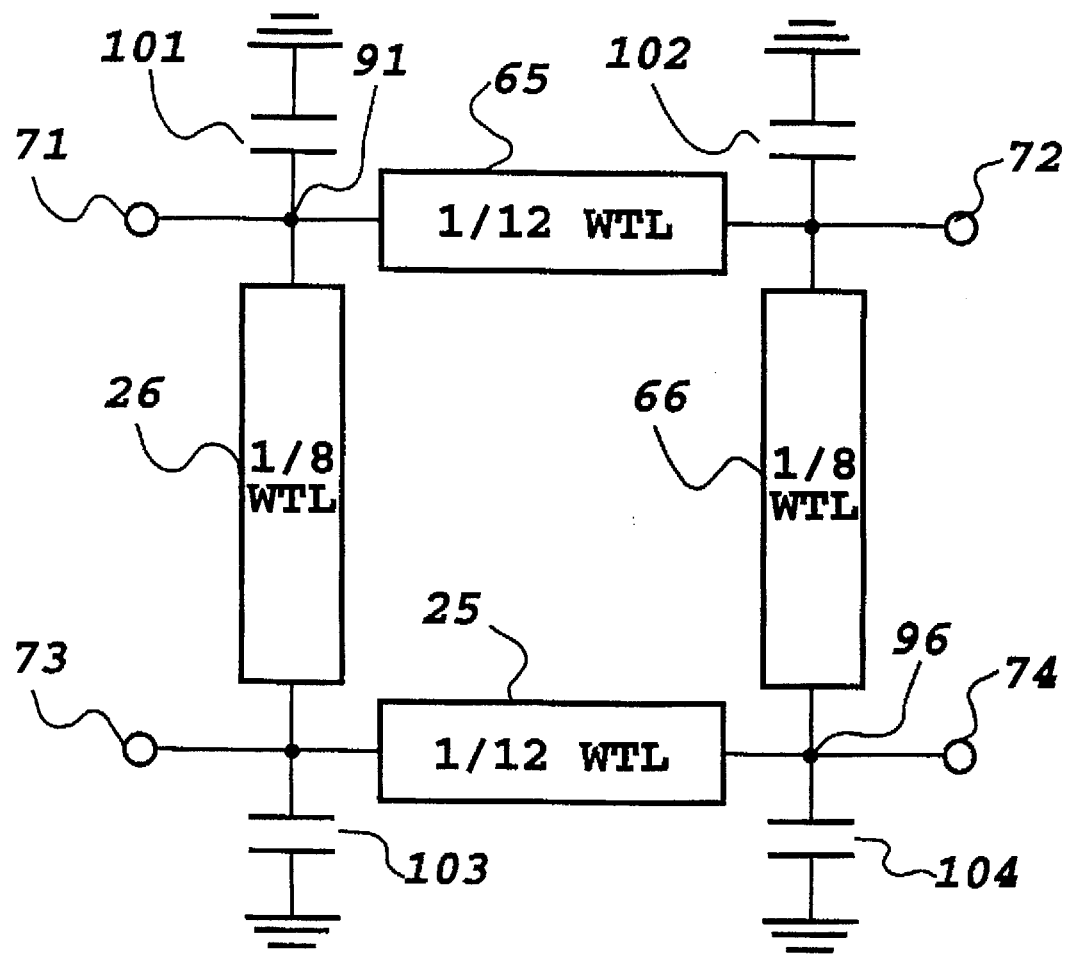
Figure 21:
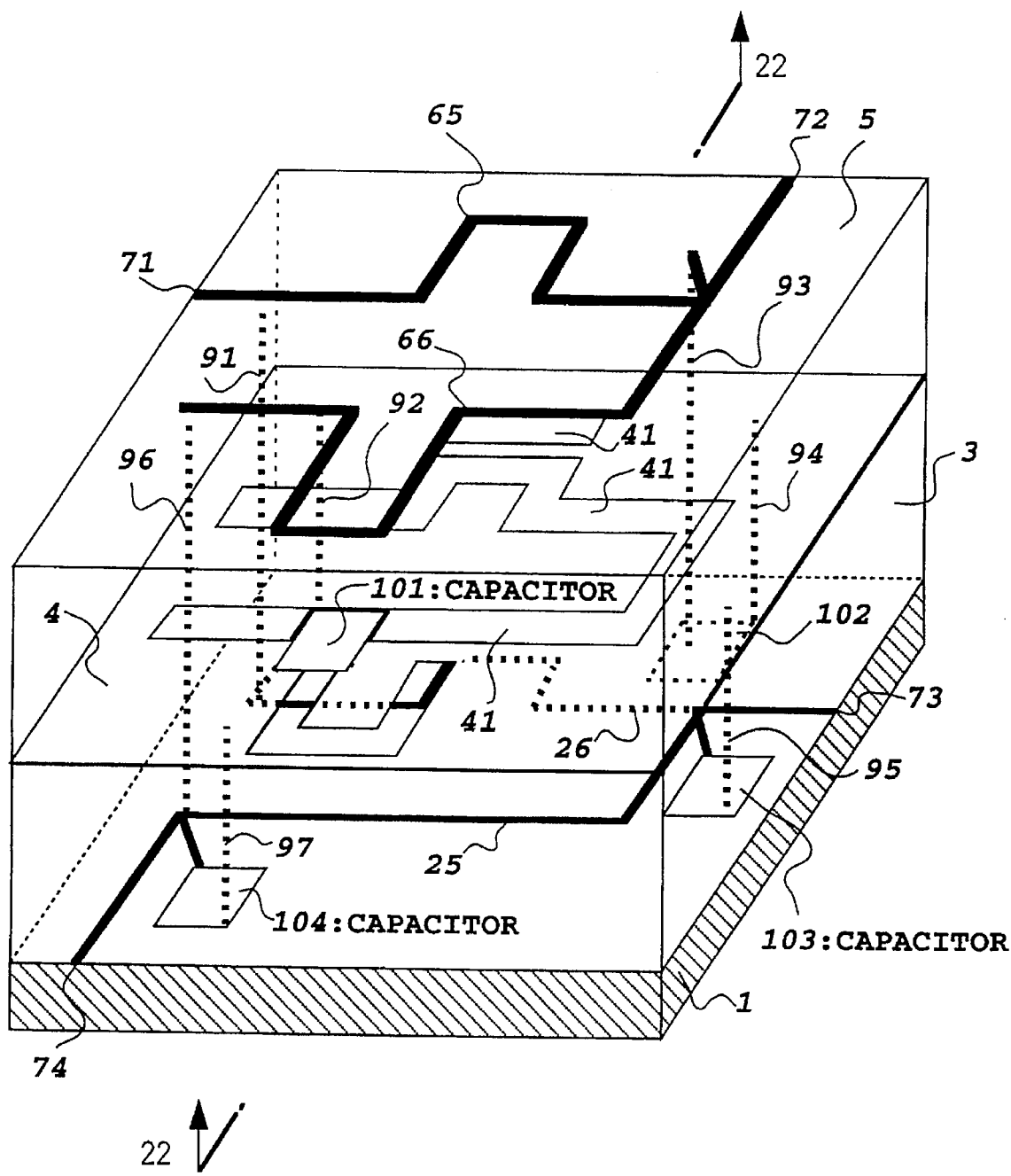
Figure 22:
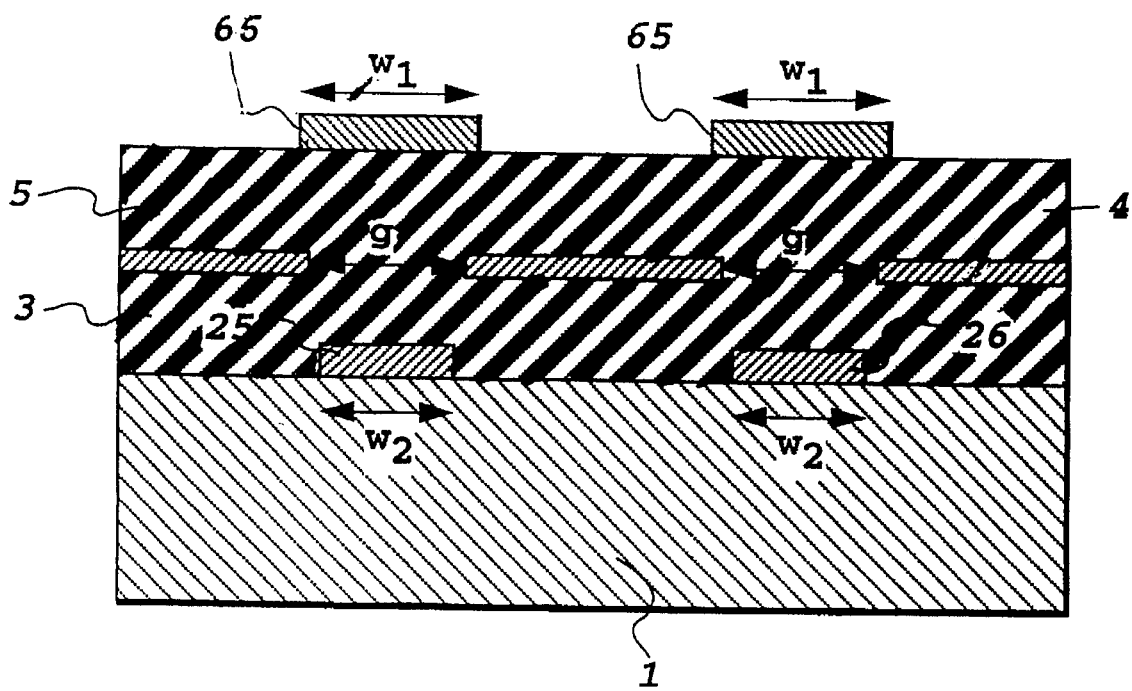
Figure 23:
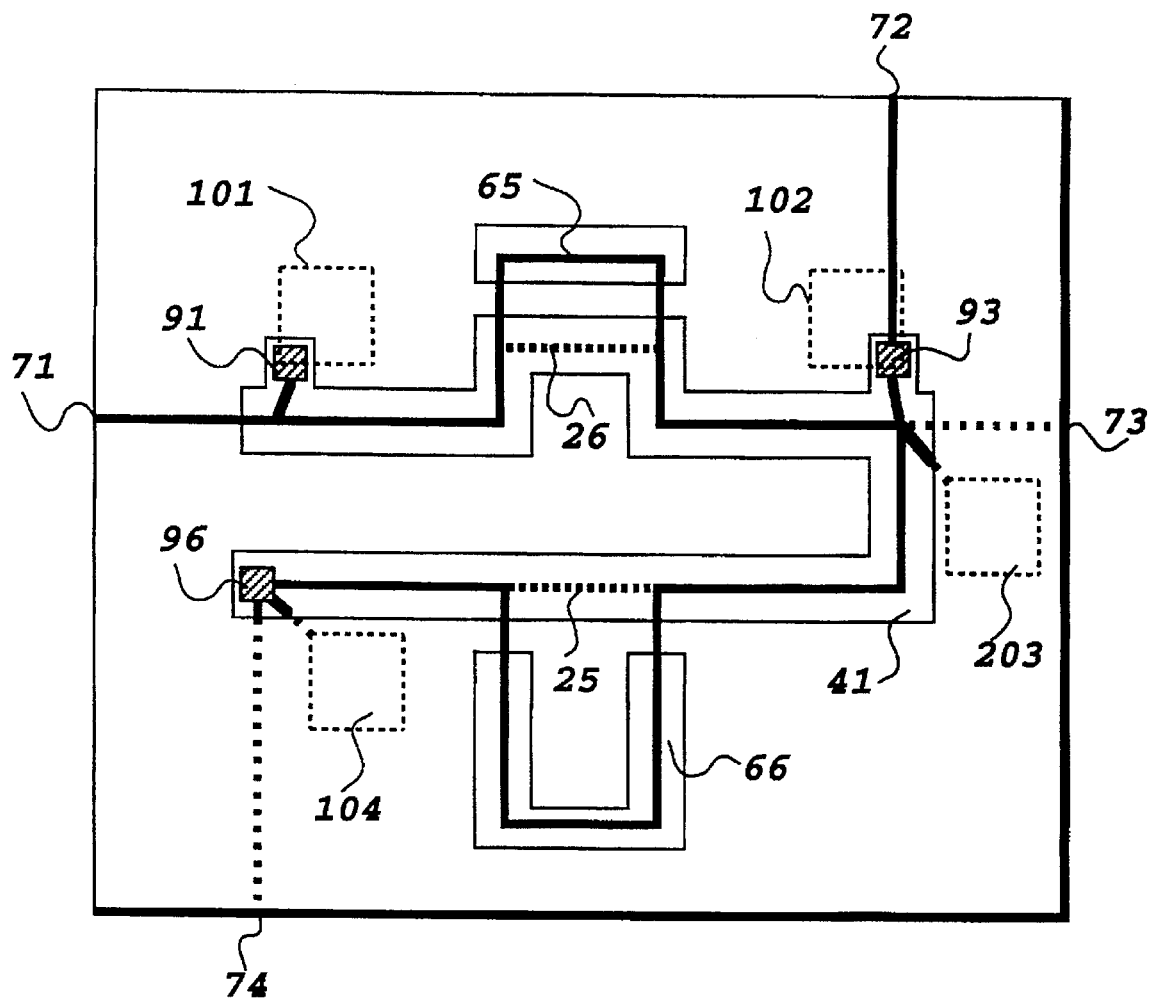
Figure 24:
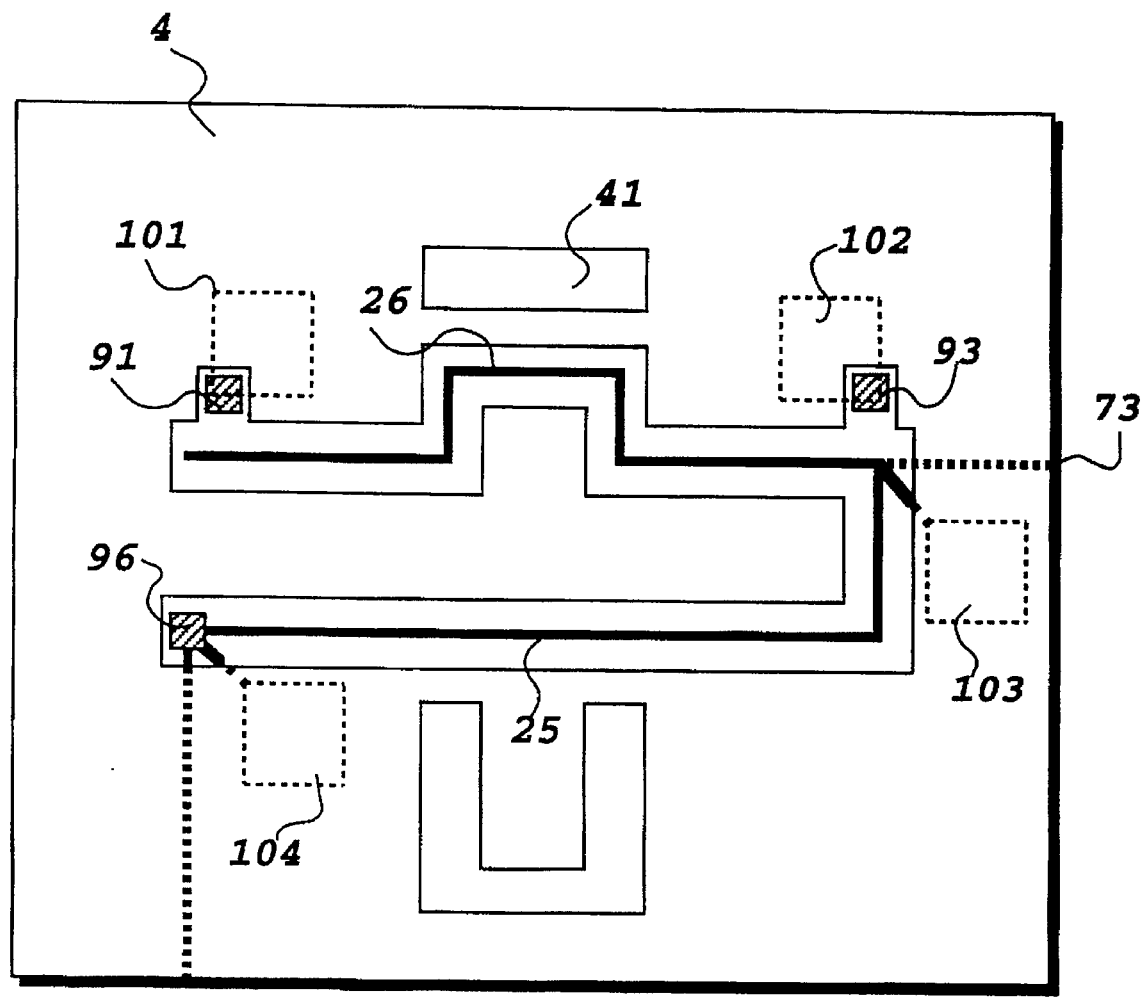

FIGS. 17–19 are diagrams showing an embodiment of a two-stage 90 degree branch-line hybrid employing the multilayer transmission line using a ground plane with a slit in accordance with the present invention. This embodiment comprises four quarter-wavelength transmission lines 21, 22, 23 and 24 formed on the semiconductor substrate 1, which are connected in a loop fashion to form a first 90 degree branch-line hybrid, and three quarter-wavelength transmission lines 61, 62 and 63 formed on the upper dielectric layer 5, which are connected with the lower quarter-wavelength transmission line 22 in a loop fashion through via holes 92 and 94 to form a second 90 degree branch-line hybrid connected in cascade with the first 90 degree branch-line hybrid. Thus, the two-stage 90 degree branch-line hybrid is implemented.

EMBODIMENT 8

FIGS. 20–24 are diagrams showing a quasi-lumped 90 degree branch line hybrid employing the multilayer transmission line using a ground metal with a slit in accordance with the present invention. This 90 degree branch-line hybrid is implemented by grounding its respective ports via capacitors, thereby forming equivalent quarter-wavelength transmission lines with short wavelength lines. A planar quasi-lumped 90 degree branch-line hybrid is disclosed, for example, by Tetsuo Hirota, et al. "Reduced-Size Branch-Line and Rat-Race Hybrids for Unipolar MMIC's", IEEE Transactions on Microwave Theory and Techniques, Vol. 38, No. 3, March 1990. This embodiment implemented three-dimensional 90 degree branch-line hybrid by employing the multilayer transmission line in accordance with the present invention.

In FIGS. 20–24, a $1/12$ wavelength transmission line 25 and a $1/8$ wavelength transmission line 26, whose character-istic impedances are 70 ohms, are formed on the semiconductor substrate 1. One end of the $1/12$ wavelength transmission line 25 is connected to the port 74, and one end of the $1/8$ wavelength transmission line 26 is connected to the upper port 71 through the via hole 91. The other ends of these wavelength lines 25 and 26 are connected to each other, and the connecting point is led to the port 73. Furthermore, four capacitors 101, 102, 103 and 104 are formed on the semiconductor substrate 1.

On the other hand, a $1/12$ wavelength transmission line 65 and a $1/8$ wavelength transmission line 66, whose characteristic impedances are 70 ohms, are formed on the top surface of the dielectric layer 5. One end of the $1/12$ wavelength transmission line 65 is connected to the port 71, and one end of the $1/8$ wavelength transmission line 66 is connected to the lower port 74 through a via hole 96. The other ends of these wavelength lines 65 and 66 are connected to each other, and the connecting point is led to the port 72.

The four capacitors 101, 102, 103 and 104 formed on the semiconductor substrate 1 are each connected between the ports 71–74 and the ground metal 4. More specifically, the capacitor 101 is connected at one end to the port 71 through the via hole 91, and at the other end to the ground metal 4 through the via hole 92. Likewise, the capacitor 102 is connected at one end to the port 72 through the via hole 93, and at the other end to the ground metal 4 through the via hole 94. The capacitor 103 is connected at one end to the port 73, and at the other end to the ground metal 4 through a via hole 95. Finally, the capacitor 104 is connected at one end to the port 74, and at the other end to the ground metal 4 through a via hole 97.

In addition, slits 41 are formed in the ground metal 4 at positions defined by projecting the wavelength lines onto the ground metal 4. Thus, the quasi-lumped 90 degree branch-line hybrid is implemented.

In this embodiment also, the slits 41 are formed in the ground metal 4, and the transmission lines 25, 26, 65 and 66 are formed above and below the ground metal 4. These transmission lines do not function as coupled lines, but function as two independent transmission lines as in the other embodiments.

The relationships between the width g of the slits 41, and the characteristic impedances and the line losses are similar to those of FIGS. 6A and 6B. That is, the characteristic impedances of the transmission lines are increased, and the losses are reduced, as the slit width g is increased. As a result, a smaller circuit can be implemented as compared with a conventional circuit.

The actual lengths of the $1/8$ wavelength transmission lines 26 and 66 were calculated as follows when their characteristic impedances were 70 ohms, and the width g of the slits 41 in the ground metal 4 was g=25 µm. With the upper $1/8$ wavelength transmission line 66, the actual length at 20 GHz was 1.15 mm when the line width $w_1$=13 µm, and the effective dielectric constant $e_{eff}$=2.9. With the lower $1/8$ wavelength transmission line 26, on the other hand, the actual length at 20 GHz was 0.7 mm when the line width $w_2$=5 µm, and the effective dielectric constant $e_{eff}$=7.6.

Figure 25:
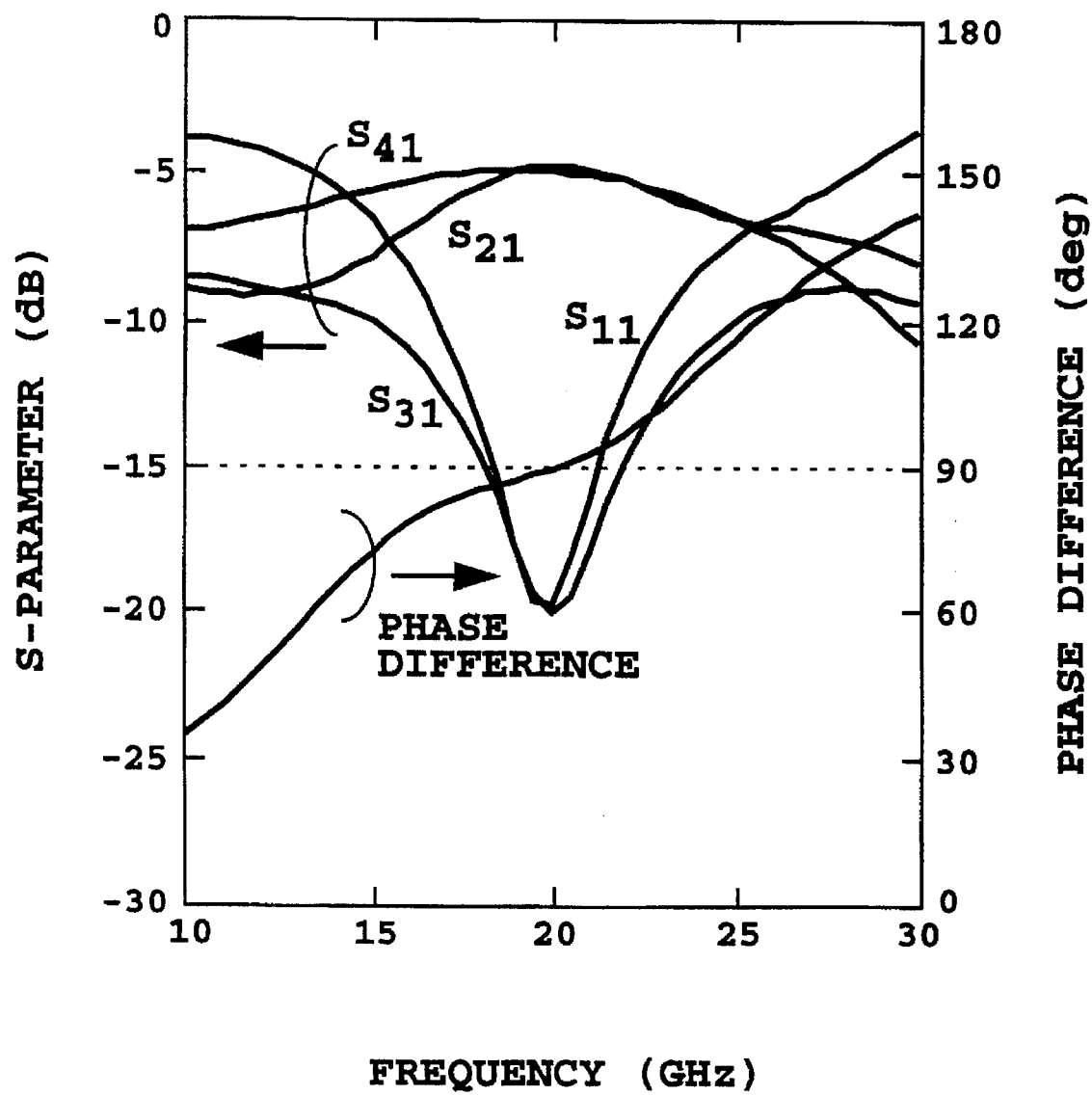
FIG. 25 is a graph illustrating measured results of circuit characteristics of the quasi-lumped 90 degree branch-line hybrid as shown in FIG. 21.

FIG. 25 shows calculation results of circuit characteristics of the hybrid fabricated in the above-mentioned dimensions. $S_{21}$ and $S_{41}$ represent the characteristics of the coupling, and $S_{31}$ represents those of the isolation. The phase difference in this figure indicates the phase differences between the signals output from the through port and the coupling port. These results show that the hybrid of this embodiment functions as a 90 degree hybrid.

EMBODIMENT 9

Figure 26:
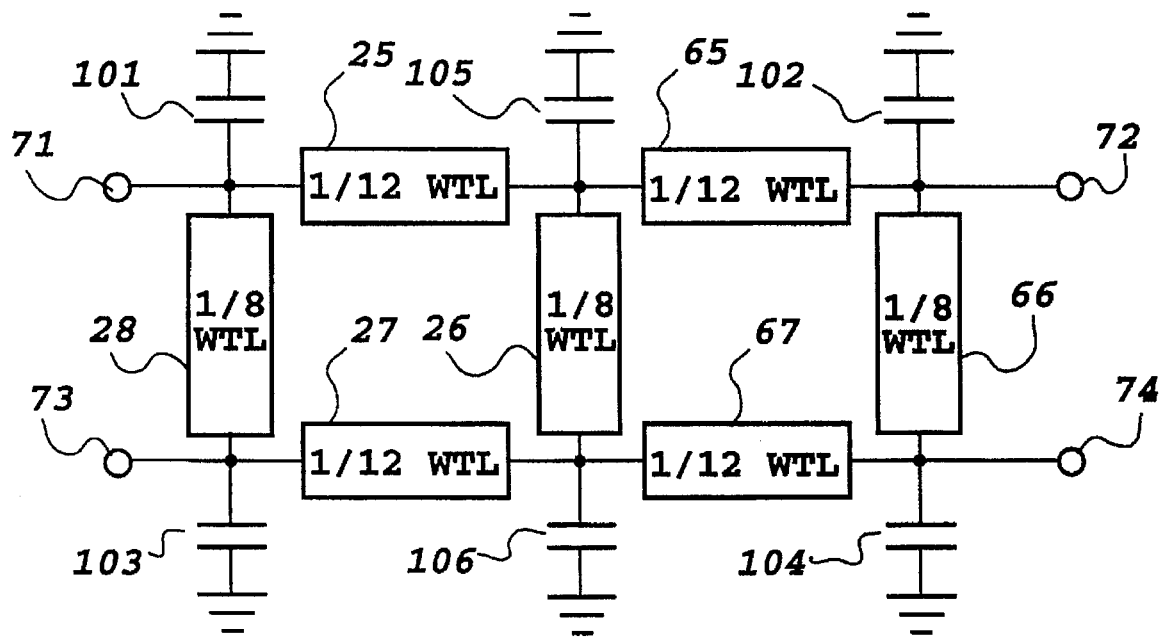
Figure 27:
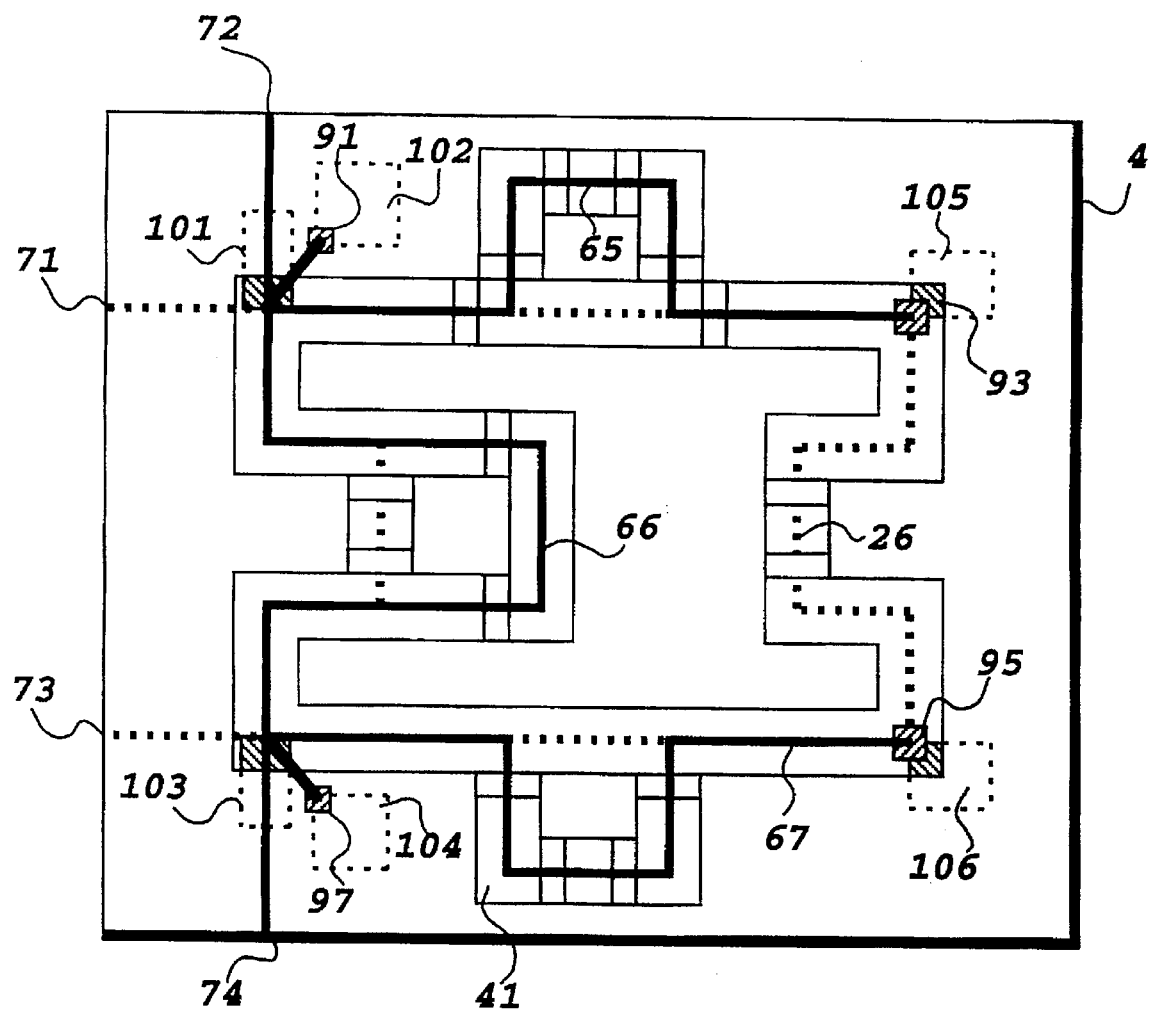
Figure 28:
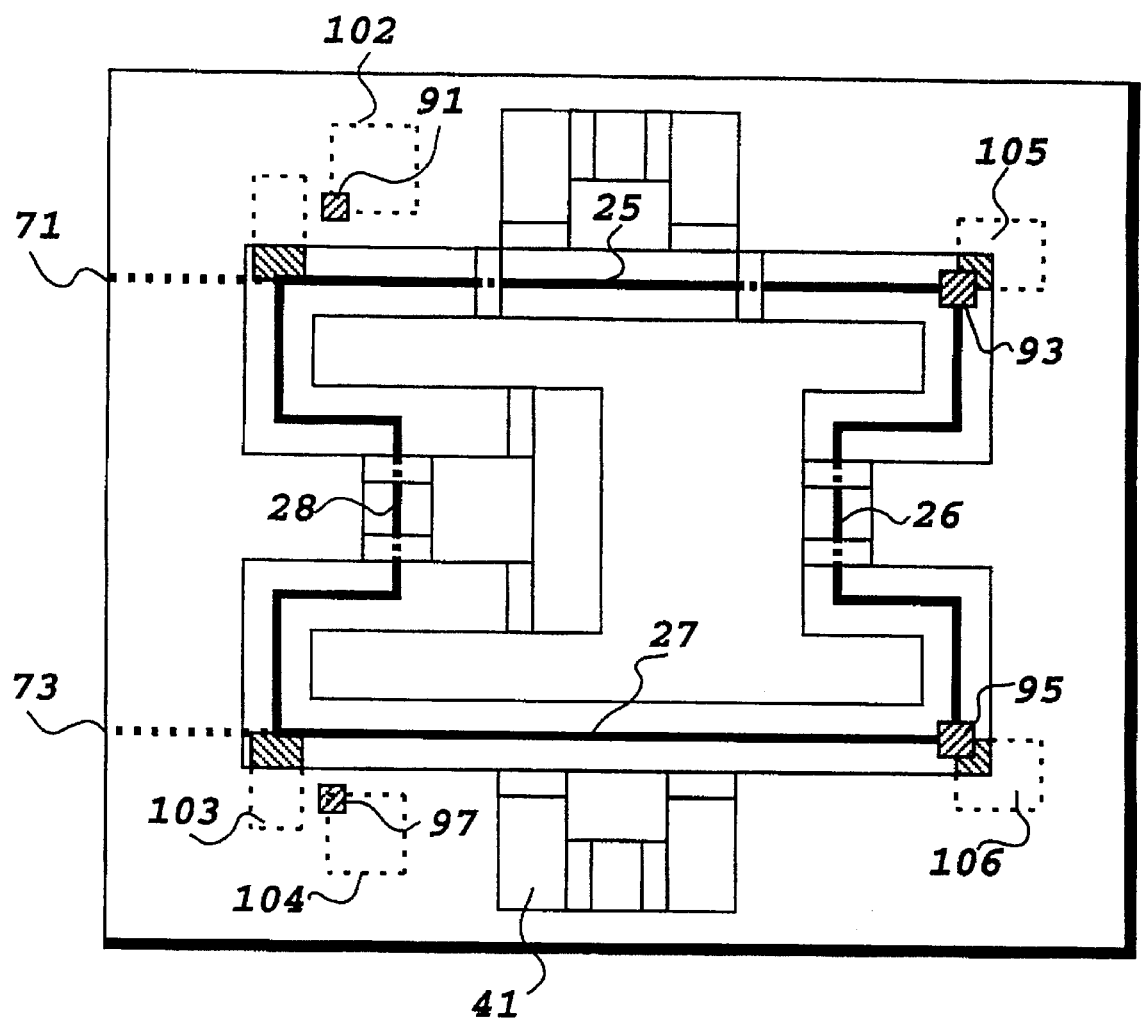

FIGS. 26–28 shows an embodiment of a quasi-lumped two-stage 90 degree branch-line hybrid employing the multilayer transmission line using a ground metal with slits in accordance with the present invention. This embodiment is formed by connecting in cascade the two quasi-lumped 90 degree branch-line hybrids of the eighth embodiment described above. In other words, its arrangement is a combination of the embodiments 7 and 8. This embodiment differs from the seventh embodiment in the following main points.

(1) Instead of the quarter-wavelength transmission lines 21 and 23 of the seventh embodiment, $\frac{1}{12}$ wavelength transmission lines 25 and 27 are formed.

(2) Instead of the quarter-wavelength transmission lines 22 and 24 of the seventh embodiment, $\frac{1}{8}$ wavelength transmission lines 26 and 28 are formed.

(3) Instead of the quarter-wavelength transmission lines 61 and 63 of the seventh embodiment, $\frac{1}{12}$ wavelength transmission lines 65 and 67 are formed.

(4) Instead of the quarter-wavelength transmission line 62 of the seventh embodiment, a $\frac{1}{8}$ wavelength transmission line 66 is formed.

(5) The connecting points of the wavelength lines are each connected to the ground metal 4 through capacitors.

The operation of the present embodiment is similar to that of the seventh embodiment.

EMBODIMENT 10

FIGS. 29–32 show an embodiment of a 180 degree rat-race hybrid employing the multilayer transmission line using a ground metal with slits in accordance with the present invention.

In these figures, a ¾ wavelength transmission line 29 is formed on the semiconductor substrate 1. On the other hand, three quarter wavelength transmission lines 62, 63 and 64 are formed on the dielectric layer 5. The three quarter-wavelength transmission lines 62–64 are connected in series, and one end thereof is connected to one end of the lower ¾ wavelength transmission line 29 through the via hole 91, and the other end thereof is connected to the other end of the ¾ wavelength transmission line 29 through the via hole 92. These connecting points are led to the ports 71 and 72. Furthermore, the connecting points of the quarter-wavelength transmission lines are led to the ports 73 and 74. The impedances of the wavelength transmission lines are 70 ohms.

Figure 29:
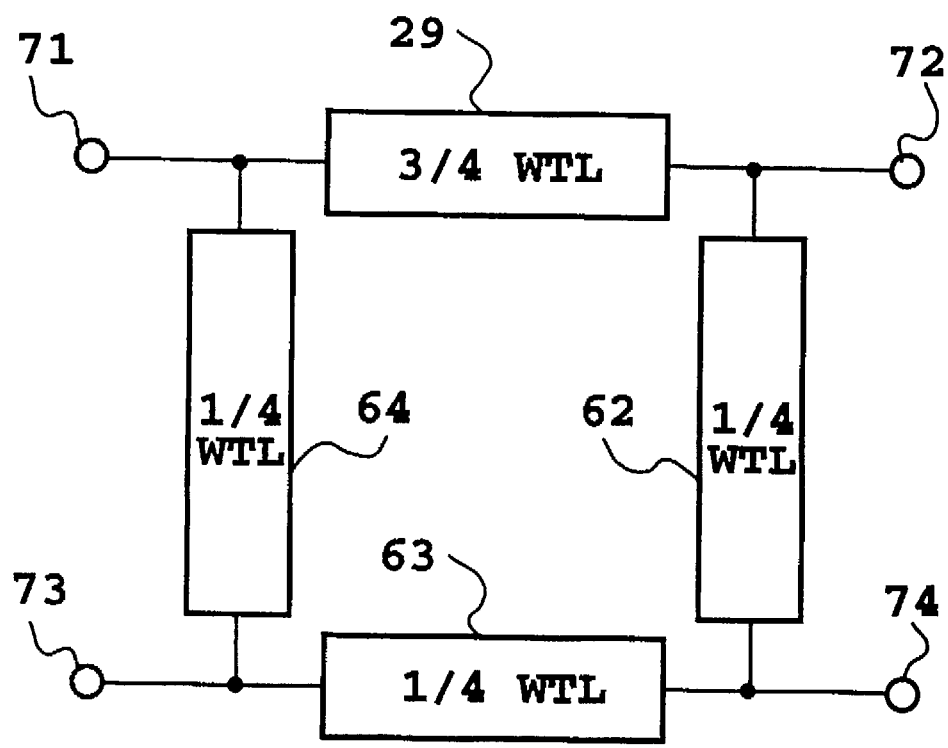
Figure 30:
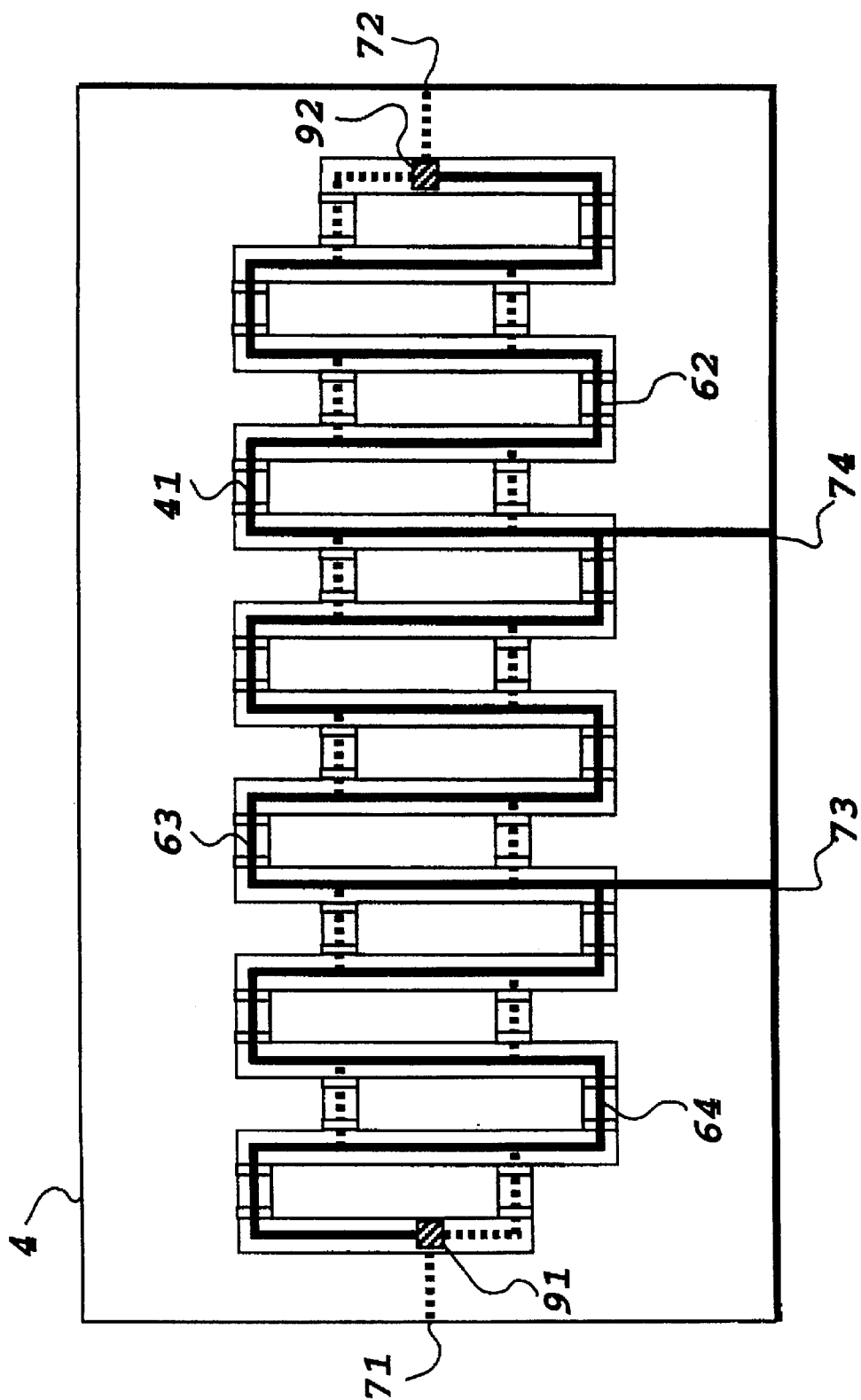
Figure 31:
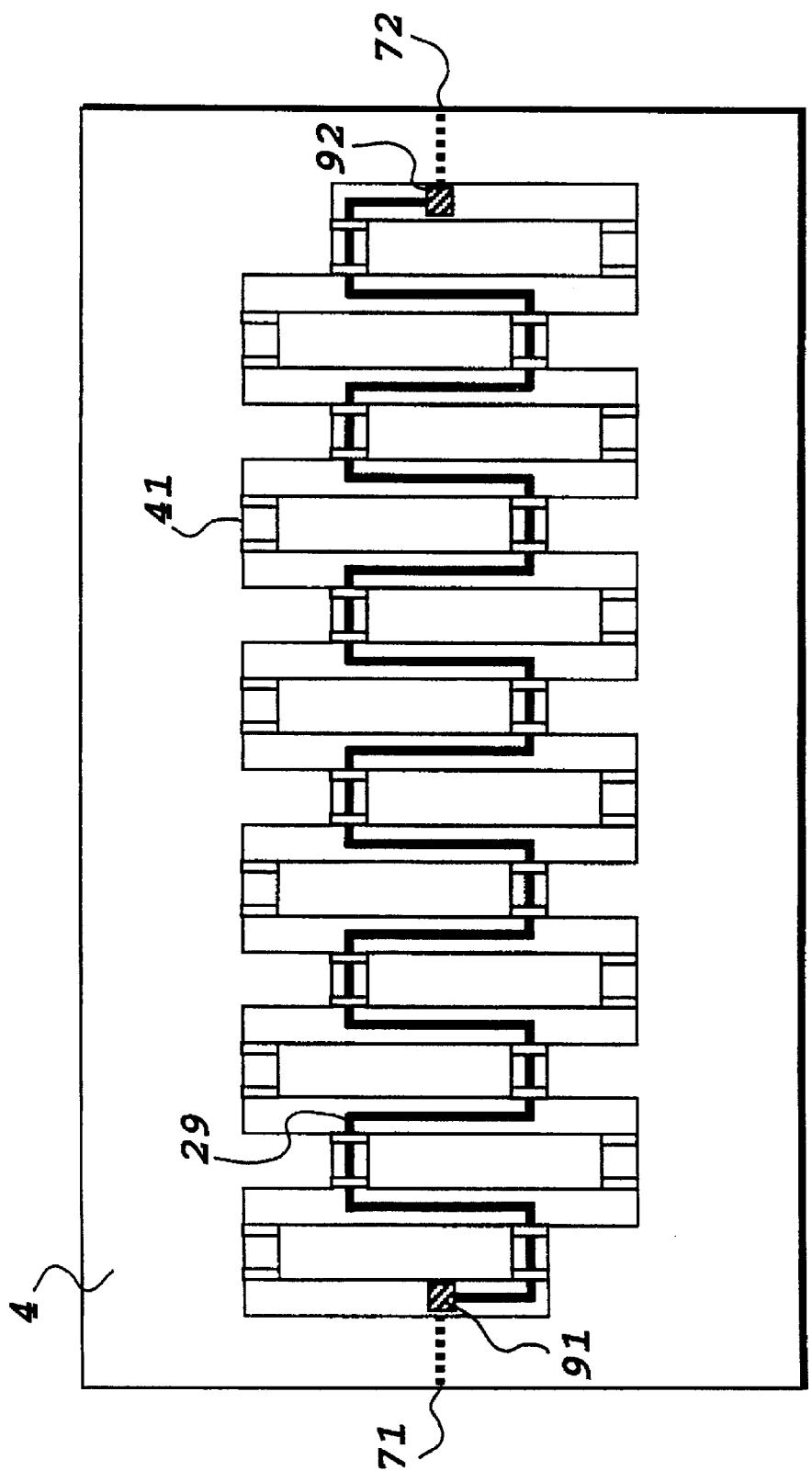

In the ground metal 4, slits 41 are formed at positions defined by projecting the ¾ wavelength transmission line 29 and the quarter wavelength transmission lines 62–64. Thus, a 180 degree rat-race hybrid is implemented with an equivalent circuit as shown in FIG. 29.

The actual lengths of the quarter-wavelength transmission lines 62–64 and the ¾ wavelength transmission line 29 were calculated as follows when their characteristic impedances were 70 ohms, and the width g of the slits 41 in the ground metal 4 was g=25 μm. With the quarter-wavelength transmission lines 62–64, the actual length at 20 GHz was 2.3 mm when the line width $w_1$=13 μm, and the effective dielectric constant $e_{eff}$=2.9. With the ¾ wavelength transmission line 26, on the other hand, the actual length at 20 GHz was 4.2 mm when the line width $w_2$=5 μm, and the effective dielectric constant $e_{eff}$=7.6.

Figure 32:
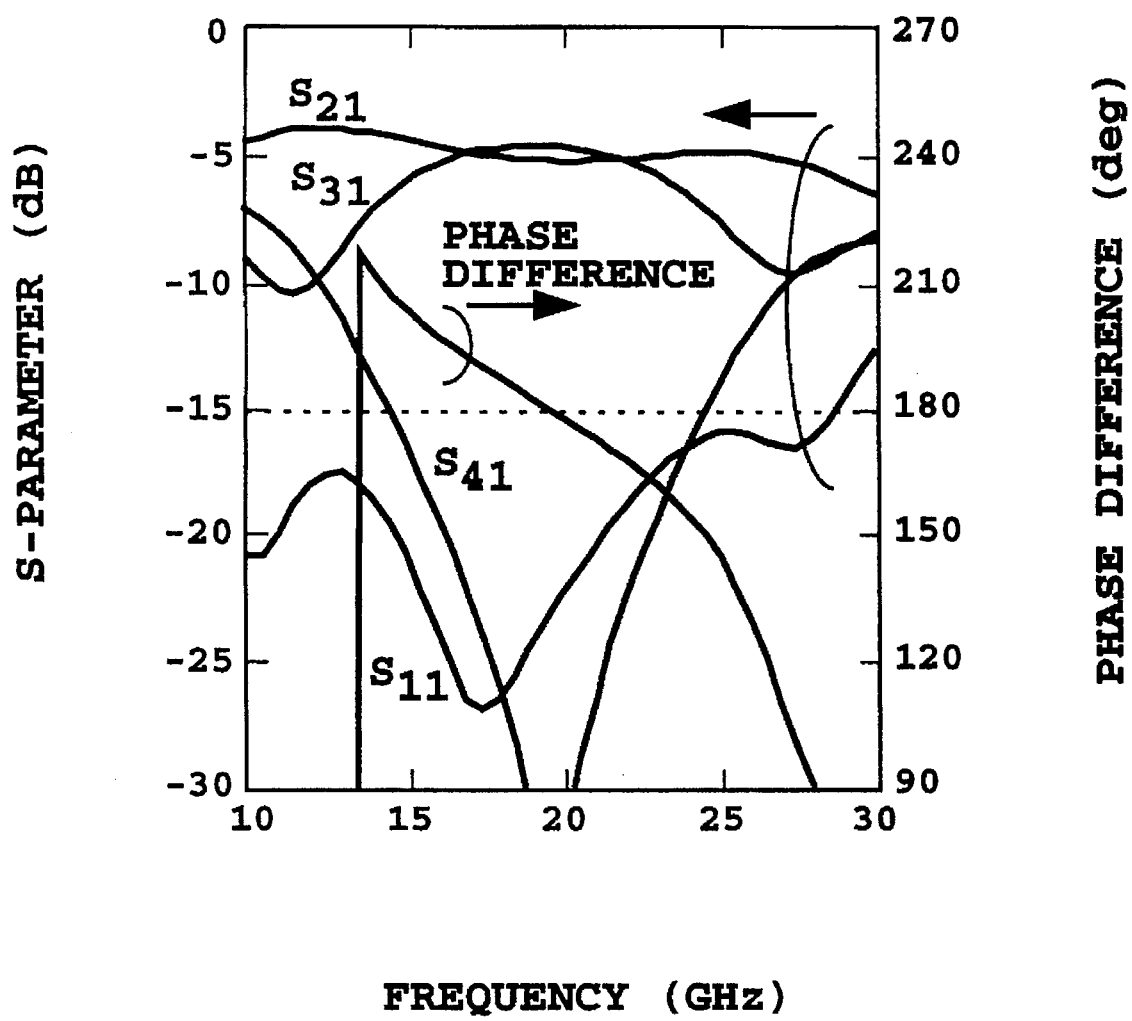
FIG. 32 is a graph illustrating measured results of circuit characteristics of the 180 degree rat-race hybrid as shown in FIG. 30.

FIG. 32 shows calculation results of circuit characteristics of the hybrid fabricated in the above-mentioned dimensions. $S_{21}$ and $S_{41}$ represent the characteristics of the coupling, and $S_{31}$ represents those of the isolation. The phase difference in this figure indicates the phase differences between the signals output from the through port and the coupling port. These results show that the hybrid of this embodiment functions as a 180 degree hybrid.

EMBODIMENT 11

Figure 33:
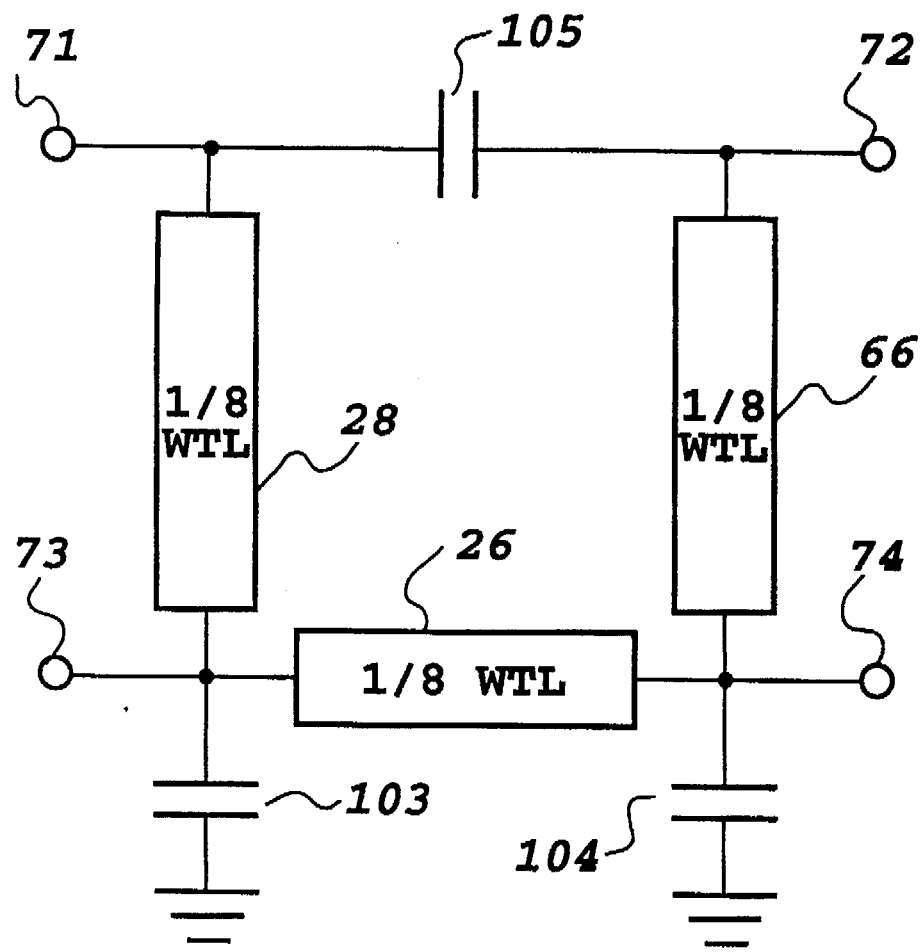
Figure 34:
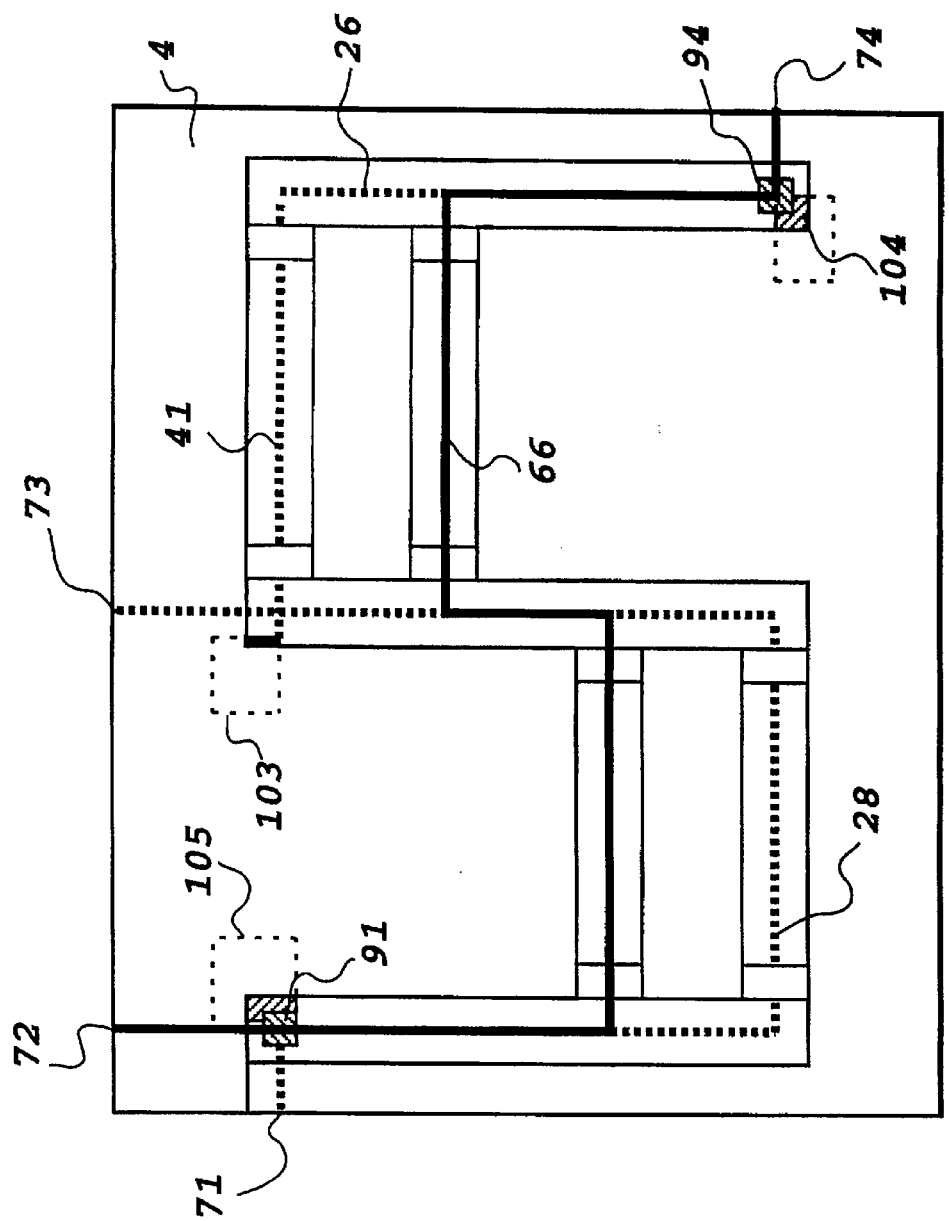
Figure 35:
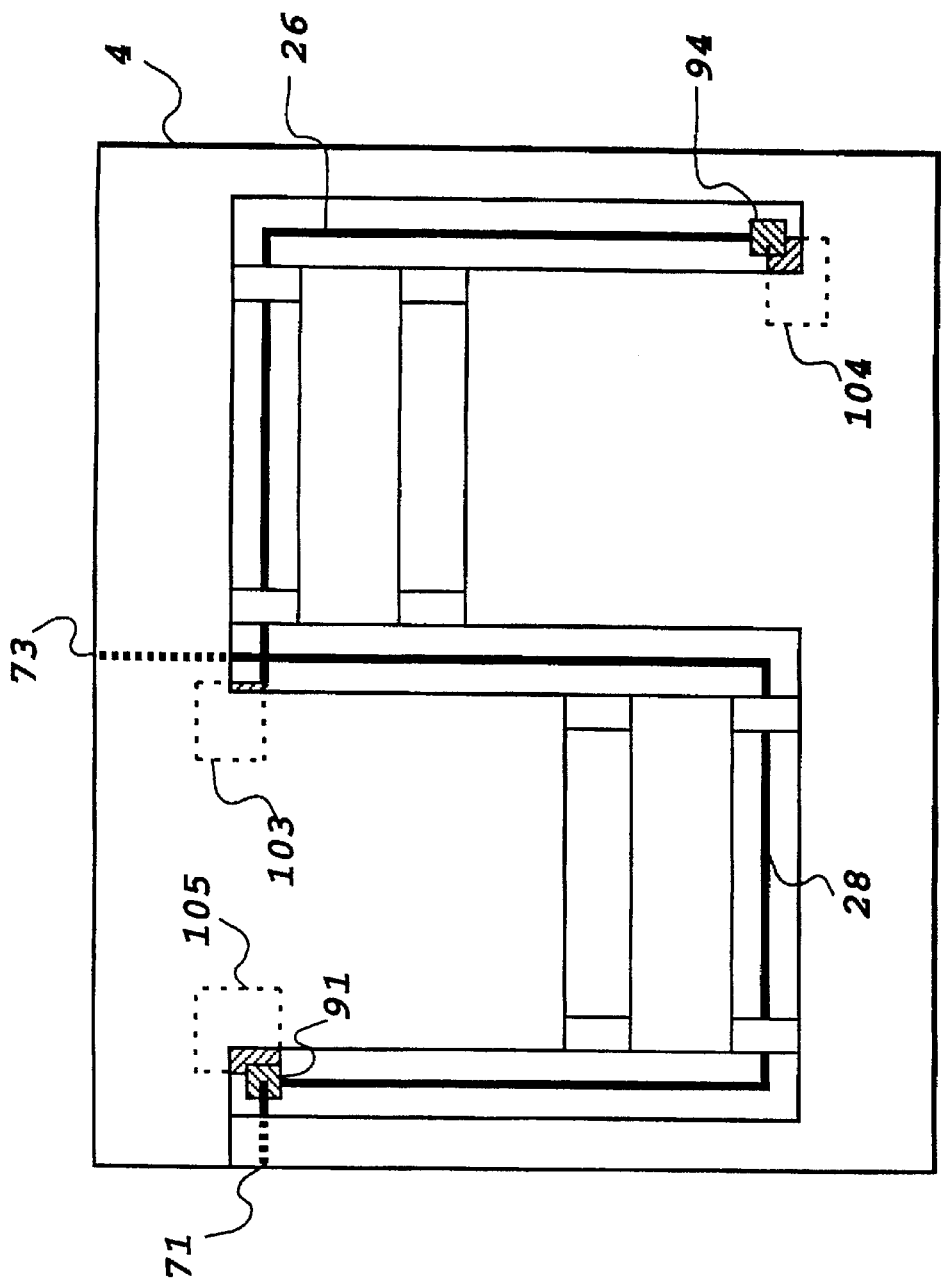

FIGS. 33–35 show an embodiment of a quasi-lumped 180 degree rat race hybrid employing the multilayer transmission line using a ground metal with a slit in accordance with the present invention.

In these figures, two $\frac{1}{8}$ wavelength transmission lines 26 and 28 with a characteristic impedance of 100 ohms are formed on the semiconductor substrate 1. On the other hand, one $\frac{1}{8}$ wavelength transmission line 66 with a characteristic impedance of 100 ohms is formed on the dielectric layer 5. The two lower-layer $\frac{1}{8}$ wavelength transmission lines 26 and 28 are connected in series, and their connecting point is connected to the port 73. One end of the $\frac{1}{8}$ wavelength transmission line 28 is led to the port 71, and one end of the $\frac{1}{8}$ wavelength transmission line 26 is led to the port 74 through the via hole 94. The port 74 is also connected to one end of the upper-layer $\frac{1}{8}$ wavelength transmission line 66, and the other end thereof is connected to the port 72.

Furthermore, capacitors 103, 104 and 105 are formed on the semiconductor substrate 1. The capacitor 105 is connected at one end to the lower port 71, and at the other end to the upper port 72 through the via hole 91. The capacitor 103 is connected between the ground metal 4 and the connecting point of the $\frac{1}{8}$ wavelength transmission lines 26 and 28, and the capacitor 104 is connected between the ground metal 4 and the connecting point of the $\frac{1}{8}$ wavelength transmission lines 26 and 66.

The slits 41 are formed in the ground metal 4 at positions defined as projections of the $\frac{1}{8}$ wavelength transmission lines 26, 28 and 66 onto the ground metal 4. Thus, the quasi-lumped 180 degree rat-race hybrid is formed with an equivalent circuit as shown in FIG. 33.

EMBODIMENT 12

FIGS. 36–39 show a reverse-phase hybrid ring employing the multilayer transmission line using a ground metal with a slit in accordance with the present invention.

The reverse-phase hybrid ring is formed by replacing the ¾ wavelength transmission line of the rat-race hybrid by a 1:–1 transformer, and is characterized by a wider operating frequency range than the rat-race hybrid.

Figure 36:
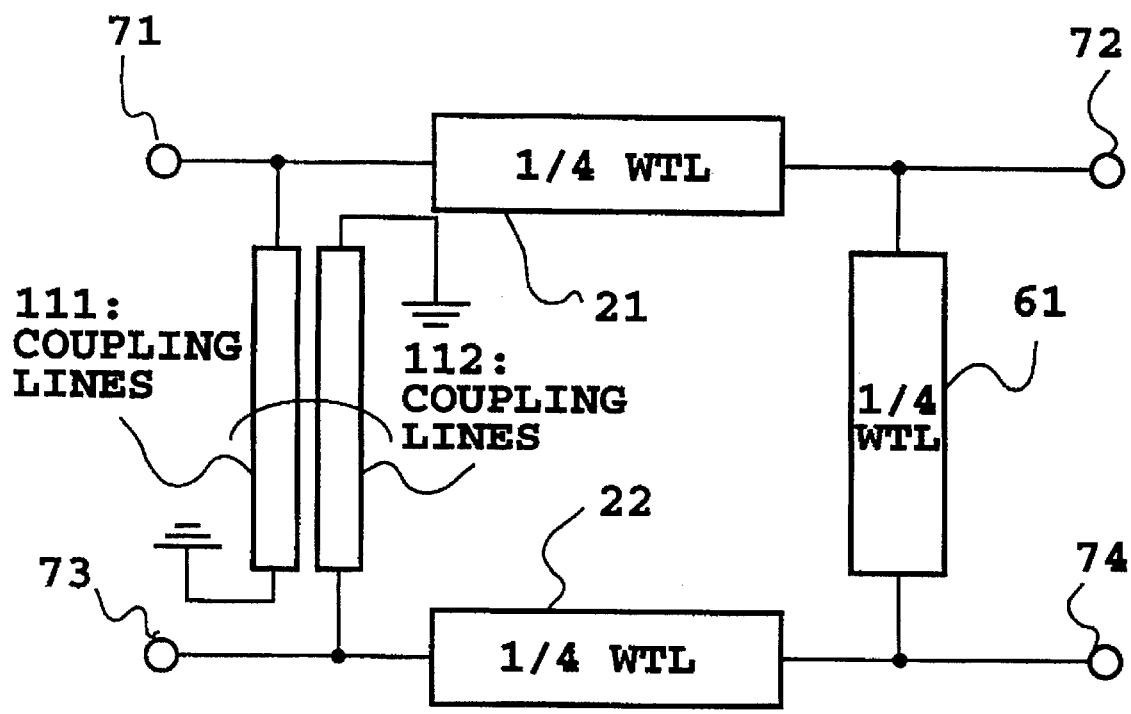

First, the operation of the reverse-phase hybrid ring will be described with reference to the equivalent circuit as shown in FIG. 36. Coupling lines consisting of two quarter-wavelength transmission lines 111 and 112 function as a 1:–1 transformer. Thus, at the port 73, a signal is obtained whose phase is advanced by 90 degrees as compared with that of the input signal to the port 71. On the other hand, at the port 72, a signal is obtained whose phase is retarded by 90 degrees as compared with that of the signal input to the port 71. Accordingly, the phase difference is 180 degrees between the signals output from the ports 72 and 73. To the port 74, a signal with its phase retarded by 180 degrees is fed from the port 72, and a signal whose phase is zero degree is fed from the port 73. As a result, these signals are canceled out each other, thereby outputting no signal from the port 74.

The present embodiment comprises a combination of three quarter wavelength transmission lines 21, 22 and 61 and a 1:–1 transformer: the former is formed by employing the multilayer transmission line using a ground metal with a slit in accordance with the present invention; and the latter is formed employing the coupled quarter wavelength transmission lines 111 and 112.

Figure 37:
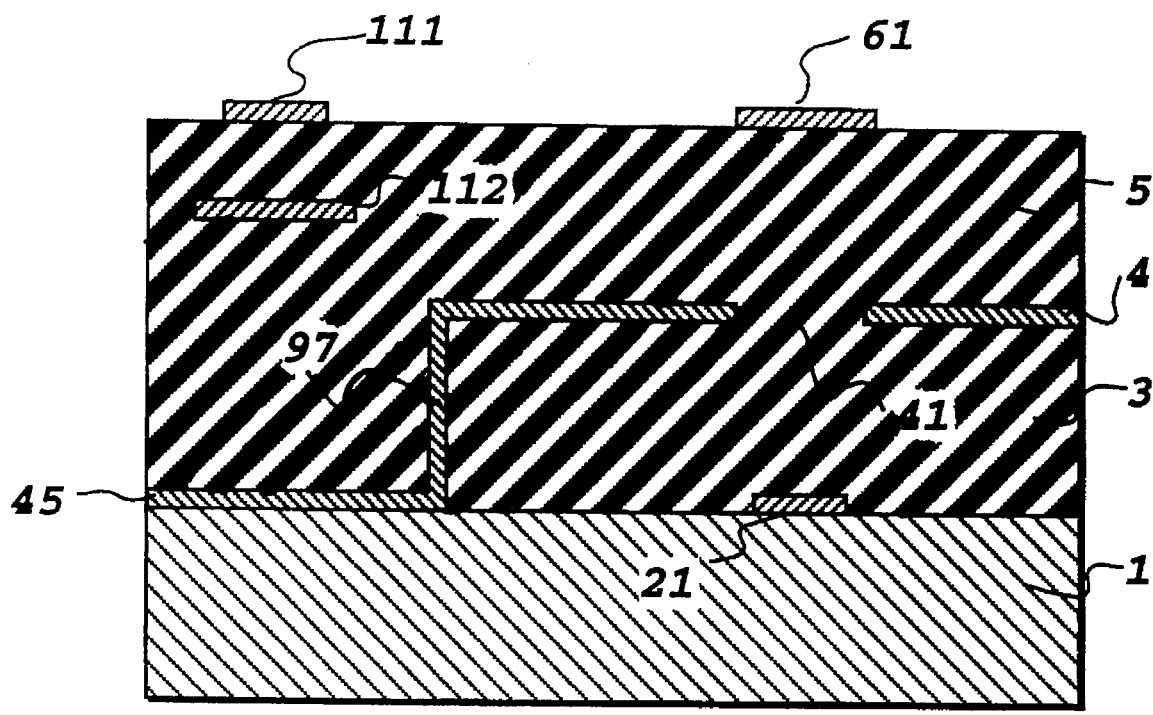
Figure 38:
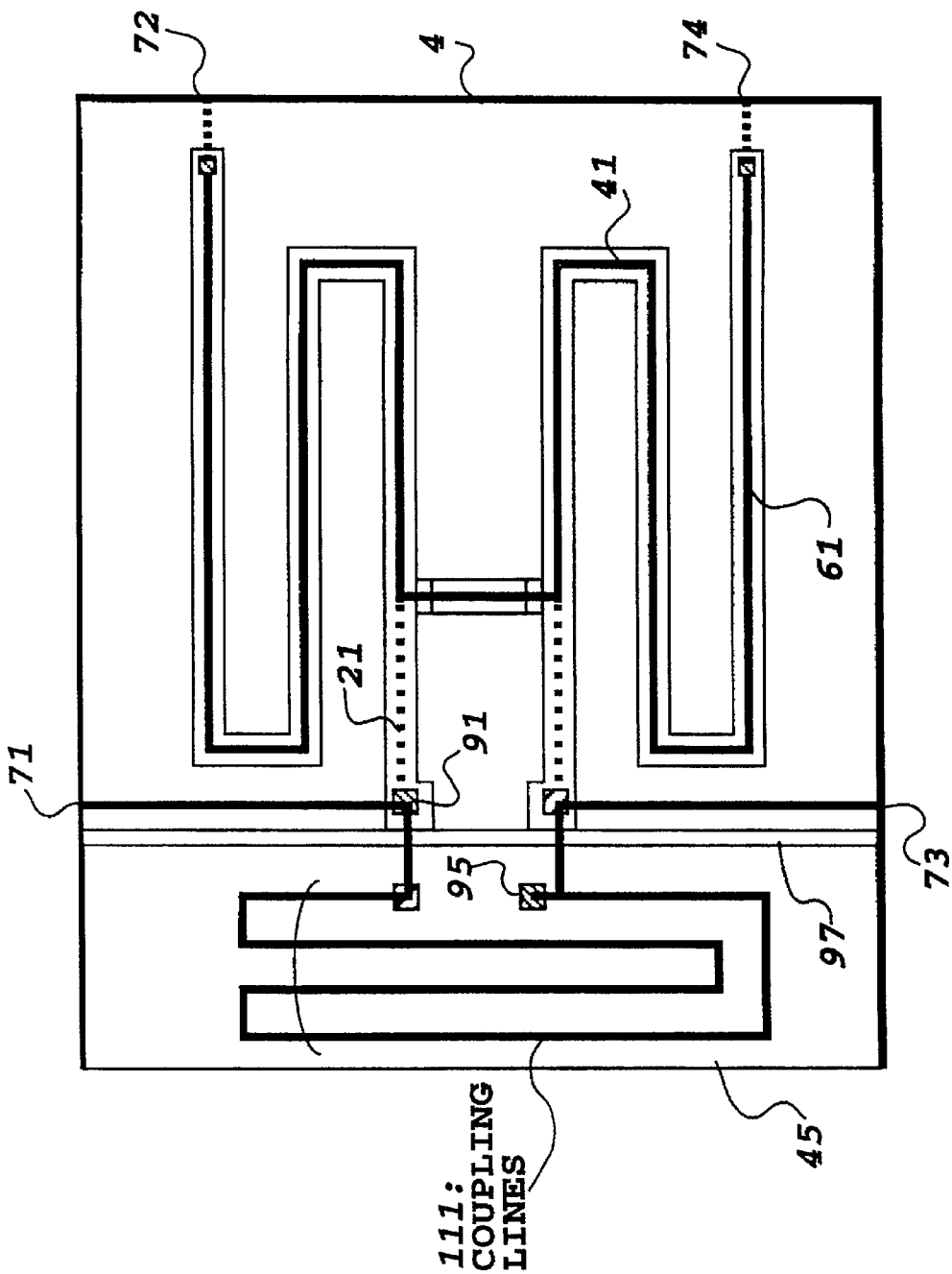
Figure 39:
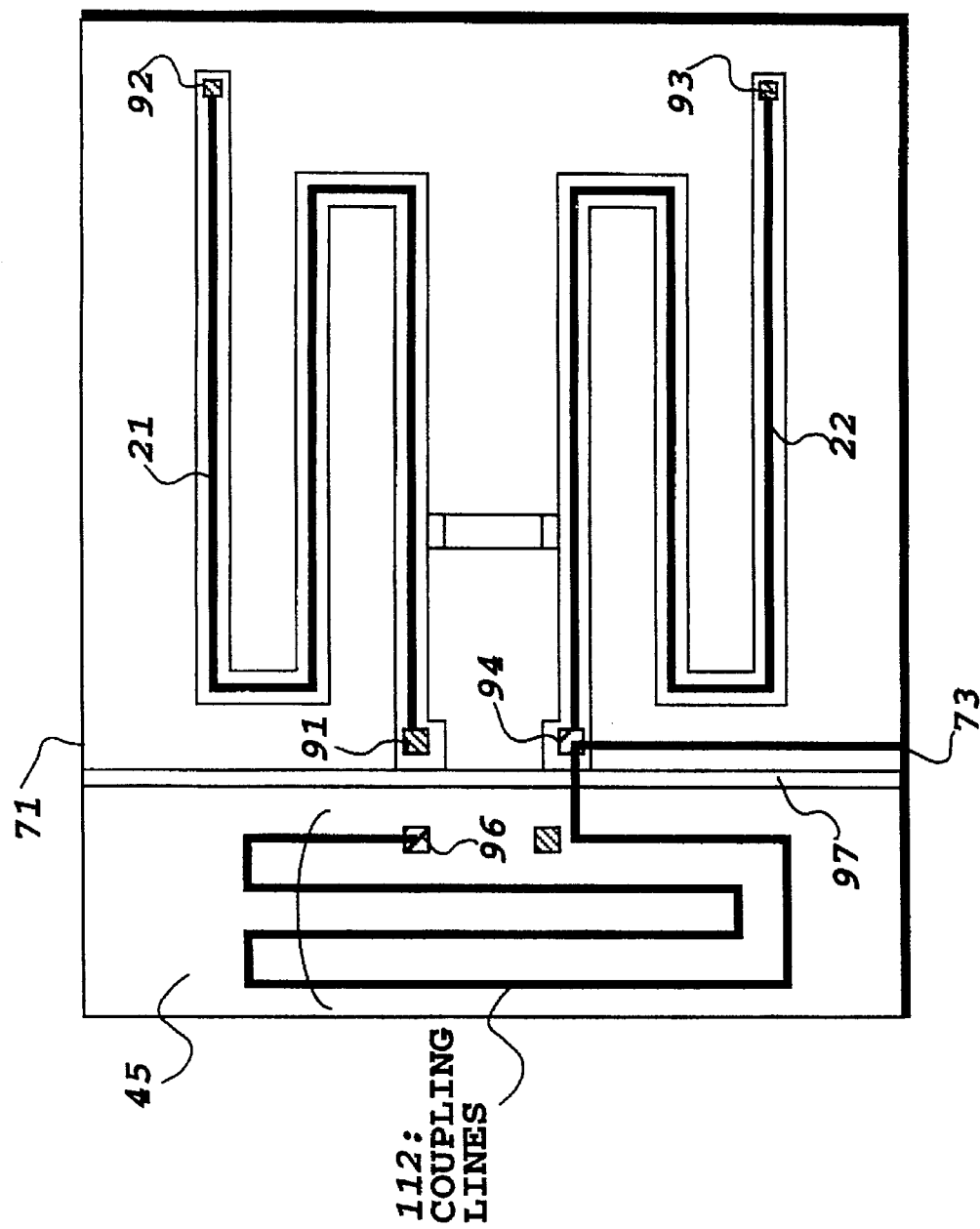

In FIGS. 37–39, two quarter-wavelength transmission lines 21 and 22 are formed on the semiconductor substrate 1. On the other hand, a quarter-wavelength transmission line 61 is formed on the dielectric layer 5. These elements are connected through via holes as shown in FIG. 36. Specifically, the port 71 formed on the upper layer is connected to one end of the lower quarter-wavelength transmission line 21 through the via hole 91. The other end of the quarter-wavelength transmission line 21 is connected to one end of the upper quarter wavelength transmission line 61 through the via hole 92, and this connecting point is led to a port 72. The other end of the quarter wavelength transmission line 61 is connected to a port 74, and to one end of the lower-layer quarter-wavelength transmission line 22 through the via hole 93. The other end of the quarter-wavelength transmission line 22 is connected to the port 73. The port 73 is formed on the same layer as the coupling line 112.

Slits 41 are formed in the ground metal 4 at positions defined by projecting the quarter-wavelength transmission lines 21, 22 and 61 onto the ground metal 4. Thus, the multilayer transmission line section is constructed.

On the other hand, the 1:−1 transform section is arranged as follows: First, a ground metal 45 is formed on the semiconductor substrate 1. The ground metal 45 is connected to the ground metal 4 through the via hole 97. Furthermore, a quarter-wavelength transmission line 111 is formed on the dielectric layer 5, and a quarter-wavelength transmission line 112 is formed thereunder in the dielectric layer 5. The quarter-wavelength transmission lines 111 and 112 are coupling lines constituting the 1:−1 transformer.

EMBODIMENT 13

Figure 40:
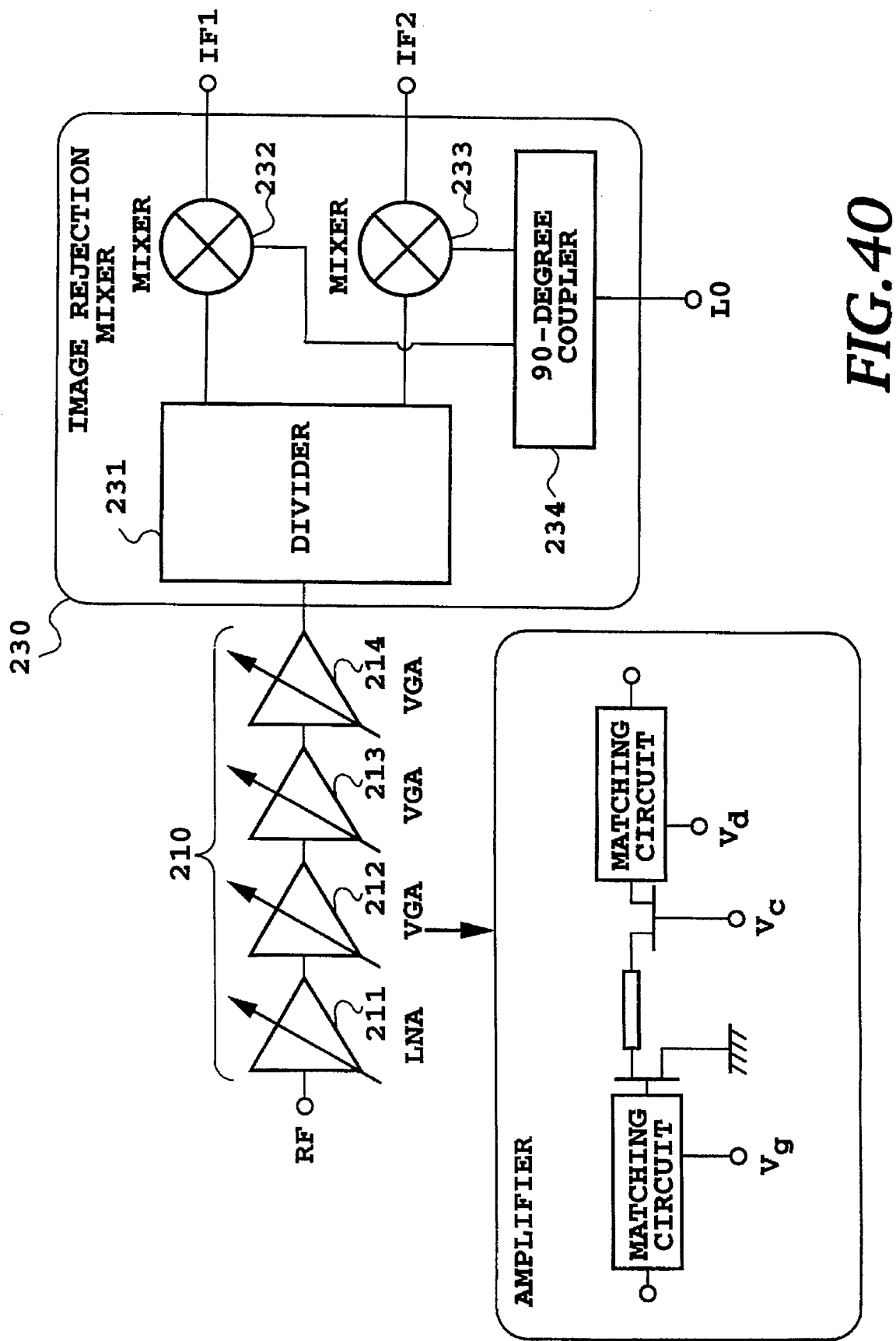
FIG. 40 is a block diagram showing a receiver with a mixer including a Wilkinson divider employing the multilayer transmission line using a ground metal with a slit in accordance with the present invention.
Figure 41:
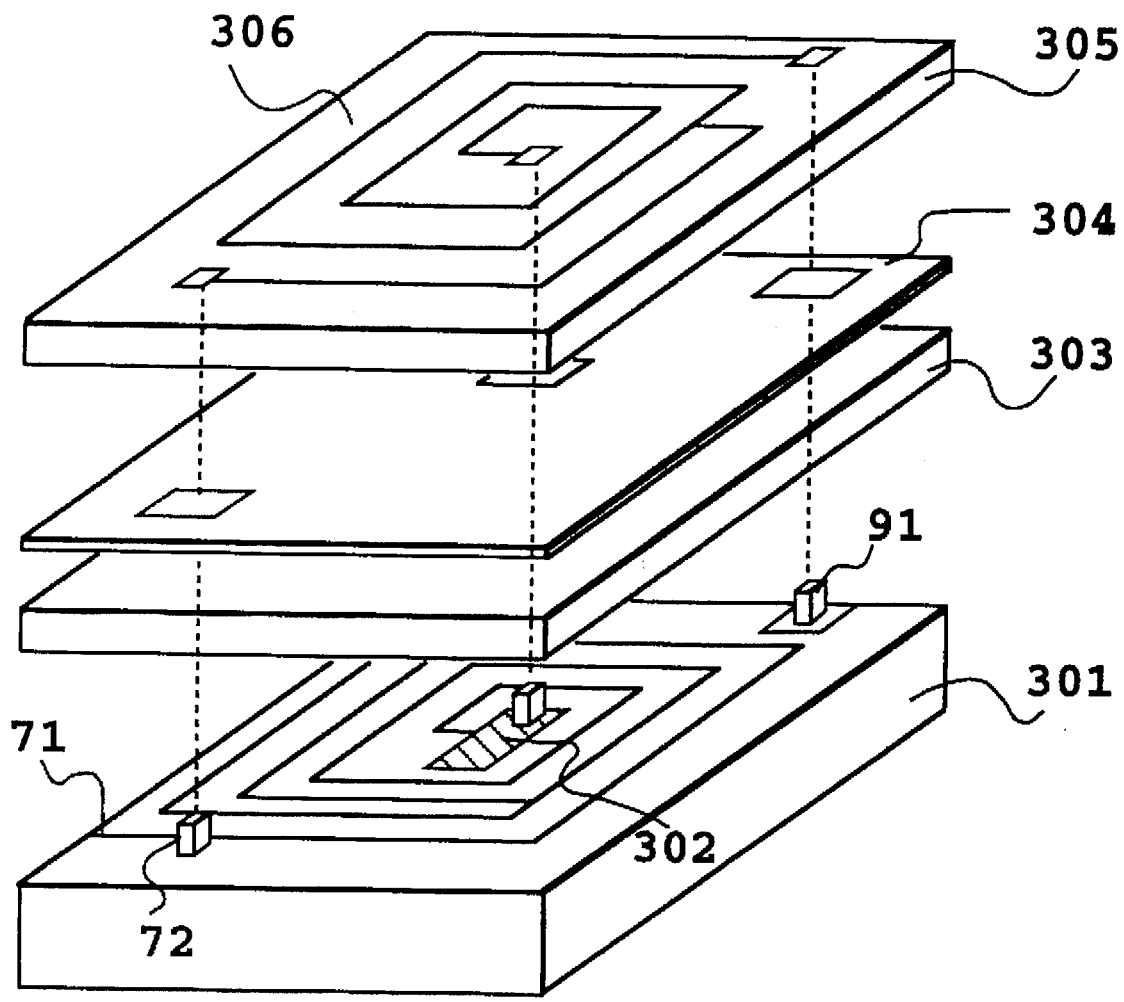
FIG. 41 is an exploded perspective view showing a circuit structure of the receiver.

FIGS. 40 and 41 show an embodiment of a one-chip receiver MMIC employing the Wilkinson divider in accordance with the present invention. The receiver comprises an RF amplifier 210 and a mixer portion 230. The RF amplifier 210 includes a low noise amplifier (LNA) 211 and three-stage variable gain amplifiers (VGAs) 212–214. Each variable gain amplifier has a cascode FET, and its gain control is carried out by adjusting the bias voltage applied to a second gate Vc.

The mixer portion 230 consisting of an image rejection mixer using two drain local injection FET mixers 232 and 233. The two mixers 232 and 233 mix the RF signals halved by the Wilkinson divider 231 with two local signals fed from a 90 degree coupler 234, respectively, thereby frequency converting them to two IF signals.

FIG. 41 shows a circuit structure of the receiver. Active devices 302 such as FETs are formed on a semiconductor substrate 301, followed by a dielectric layer 303, a ground metal 304, a dielectric layer 305 and matching circuits 306, which are formed in this order. Thus, a miniature, high density MMIC is achieved by adopting a multilayer structure, and by forming transmission lines constituting the matching circuits 306 in a spiral fashion around the FETs. Furthermore, the area occupied by the divider is nearly halved by using the Wilkinson divider in accordance with the present invention.

As describe above, in the multilayer transmission line using a ground metal with a slit in accordance with the present invention and hybrids employing the transmission line, the actual lengths of the upper and lower transmission lines greatly differ. This is because the dielectric constants of the transmission lines formed above and below the ground metal differ greatly. Accordingly, the coupling between the upper and lower transmission lines can be kept very small in spite of the slits. As a result, microwave hybrids can be implemented with good characteristics. In addition, since the transmission lines are stacked, the circuit area can be reduced by a factor of 2 or more. Moreover, since the dimensions are very small such that the line widths are 5–10 μm, and the thickness of the dielectric layer is 5 μm, the transmission lines can be formed in a meander fashion with the coupling between the lines kept loose. This makes it possible to further reduce the circuit area.

The present invention has been described in detail with respect to various embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A transmission line comprising:

a substrate;

a first dielectric layer formed on said substrate;

a ground metal formed on said first dielectric layer;

a second dielectric layer formed on said ground metal;

a first transmission line formed between said substrate and said first dielectric layer;

a second transmission line formed on said second dielectric layer; and a slit formed in said ground metal, wherein said substrate has a greater dielectric constant than said first dielectric layer.

2. The transmission line as claimed in claim 1, wherein said slit is formed at a position defined by projecting said first transmission line and said second transmission line onto said ground metal.

3. The transmission line as claimed in claim 1, wherein said substrate comprises a third dielectric layer formed on said substrate, and said first transmission line is formed between said third dielectric layer and said first dielectric layer.

4. The transmission line as claimed in claim 1, wherein said substrate is a semiconductor substrate.

5. The transmission line as claimed in claim 1, wherein said substrate is a dielectric substrate.

6. The transmission line as claimed in claim 1, wherein said substrate is a ceramic substrate.

7. A Wilkinson divider including two or more quarter-wavelength transmission lines, said Wilkinson divider comprising:

a substrate;

a first dielectric layer formed on said substrate;

a ground metal formed on said first dielectric layer;

a second dielectric layer formed on said ground metal;

a first transmission line formed between said substrate and said first dielectric layer;

a second transmission line formed on said second dielectric layer; and a slit formed in said ground metal, wherein said substrate has a greater dielectric constant than said first dielectric layer, and said first transmission line and said second transmission line constitute said quarter-wavelength transmission lines of said Wilkinson divider.

8. The Wilkinson divider as claimed in claim 7, wherein said Wilkinson divider is a single-stage two-output Wilkinson divider, and said first transmission line and said second transmission line each include one of said quarter-wavelength transmission lines.

9. The Wilkinson divider as claimed in claim 7, wherein said Wilkinson divider is a multi-stage Wilkinson divider, and said first transmission line and said second transmission line each include at least two of said quarter-wavelength transmission lines.

10. The Wilkinson divider as claimed in claim 7, wherein said Wilkinson divider is a multi-output Wilkinson divider with three or more outputs, and at least one of said first transmission line and said second transmission line includes a plurality of quarter-wavelength transmission lines with their one ends connected to an input port and the other ends connected to said outputs.

11. The hybrid as claimed in claim 7, wherein said slits is formed at a position defined by projecting said first transmission line and said second transmission line onto said ground metal.

12. The hybrid as claimed in claim 7, wherein said substrate comprises a third dielectric layer formed between said substrate and said first dielectric layer, and said first transmission line is formed between said third dielectric layer and said first dielectric layer.

13. The hybrid as claimed in claim 7, wherein said substrate is a semiconductor substrate.

14. The hybrid as claimed in claim 7, wherein said substrate is a dielectric substrate.

15. The hybrid as claimed in claim 7, wherein said substrate is a ceramic substrate.

16. A 90 degree branch-line hybrid including four quarter-wavelength transmission lines connected in a loop fashion, said 90 degree branch line hybrid comprising:
  a substrate;
  a first dielectric layer formed on said substrate;
  a ground metal formed on said first dielectric layer;
  a second dielectric layer formed on said ground metal;
  a first transmission line formed between said substrate and said first dielectric layer;
  a second transmission line formed on said second dielectric layer; and
  a slit formed in said ground metal,
  wherein said substrate has a greater dielectric constant than said first dielectric layer, and said first transmission line and said second transmission line constitute said quarter-wavelength transmission lines of said 90 degree branch-line hybrid.

17. The 90 degree branch-line hybrid as claimed in claim 16, wherein said 90 degree branch-line hybrid is a multi-stage 90 degree branch line hybrid, and said first transmission line and said second transmission line each include at least three quarter-wavelength transmission lines.

18. A quasi-lumped 90 degree branch-line hybrid including wavelength transmission lines connected in a loop, and capacitors connected between ground and respective connecting points of the wavelength transmission lines, said quasi-lumped 90 degree branch-line hybrid comprising:
  a substrate;
  a first dielectric layer formed on said substrate;
  a ground metal formed on said first dielectric layer;
  a second dielectric layer formed on said ground metal;
  a first transmission line formed between said substrate and said first dielectric layer;
  a second transmission line formed on said second dielectric layer; and
  a slit formed in said ground metal,
  wherein said substrate has a greater dielectric constant than said first dielectric layer, and said first transmission line and said second transmission line constitute said wavelength transmission lines of said quasi-lumped 90 degree branch-line hybrid.

19. The quasi-lumped 90 degree branch-line hybrid as claimed in claim 18, wherein said first transmission line and said second transmission line each include $1/12$ wavelength transmission line and $1/8$ wavelength transmission line, which are connected alternately in a loop.

20. The quasi-lumped 90 degree branch-line hybrid as claimed in claim 18, wherein said quasi-lumped 90 degree branch-line hybrid is a multi stage quasi-lumped 90 degree branch-line hybrid, and said first transmission line and said second transmission line each include at least three wavelength transmission lines.

21. A 180 degree rat-race hybrid including a ¾ wavelength transmission line and three quarter-wavelength transmission lines connected in a loop, said 180 degree rat-race hybrid comprising:
  a substrate;
  a first dielectric layer formed on said substrate;
  a ground metal formed on said first dielectric layer;
  a second dielectric layer formed on said ground metal;
  a first transmission line formed between said substrate and said first dielectric layer;
  a second transmission line formed on said second dielectric layer; and
  a slit formed in said ground metal,
  wherein said substrate has a greater dielectric constant than said first dielectric layer, and said first transmission line and said second transmission line constitute said ¾ wavelength transmission line and said quarter-wavelength transmission lines of said 180 degree rat-race hybrid.

22. A quasi-lumped 180 degree rat-race hybrid including wavelength transmission lines connected in a loop, and capacitors connected between ground and respective connecting points of the wavelength transmission lines, said 180 degree rat-race hybrid comprising:
  a substrate;
  a first dielectric layer formed on said substrate;
  a ground metal formed on said first dielectric layer;
  a second dielectric layer formed on said ground metal;
  a first transmission line formed between said substrate and said first dielectric layer;
  a second transmission line formed on said second dielectric layer; and
  a slit formed in said ground metal,
  wherein said substrate has a greater dielectric constant than said first dielectric layer, and said first transmission line and said second transmission line constitute said wavelength transmission lines of said quasi-lumped 180 degree rat-race hybrid.

23. The quasi-lumped 180 degree rat-race hybrid as claimed in claim 22, wherein said first transmission line includes two $1/8$ wavelength transmission lines and said second transmission line includes one $1/8$ wavelength transmission line, which are connected in a loop with a capacitor.

24. A reverse-phase hybrid ring including a 1:−1 transformer and three quarter-wavelength transmission lines connected in a loop, said phase inverting hybrid comprising:
  a substrate;
  a first dielectric layer formed on said substrate;
  a ground metal formed on said first dielectric layer;
  a second dielectric layer formed on said ground metal;

a first transmission line formed between said substrate and said first dielectric layer;

a second transmission line formed on said second dielectric layer; and a slit formed in said ground metal, wherein said substrate has a greater dielectric constant than said first dielectric layer, and said first transmission line and said second transmission line constitute said quarter-wavelength transmission lines of said phase inverting hybrid.

25. A receiver including an RF amplifier, and a mixer having a divider, said divider comprising:

a substrate;

a first dielectric layer formed on said substrate;

a ground metal formed on said first dielectric layer;

a second dielectric layer formed on said ground metal;

a first transmission line formed between said substrate and said first dielectric layer;

a second transmission line formed on said second dielectric layer; and a slit formed in said ground metal, wherein said substrate has a greater dielectric constant than said first dielectric layer, and said first transmission line and said second transmission line constitute said quarter-wavelength transmission lines of said divider.

26. An image rejection mixer which mixes a plurality of RF signals with local signals to output IF signals, the RF signals being obtained by dividing a received RF signal by a divider including two or more quarter-wavelength transmission lines with their one ends provided with said received RF signal and the other ends each outputting said plurality of RF signals, said divider comprising:

a substrate;

a first dielectric layer formed on said substrate;

a ground metal formed on said first dielectric layer;

a second dielectric layer formed on said ground metal;

a first transmission line formed between said substrate and said first dielectric layer;

a second transmission line formed on said second dielectric layer; and a slit formed in said ground metal, wherein said substrate has a greater dielectric constant than said first dielectric layer, and said first transmission line and said second transmission line constitute said quarter-wavelength transmission lines of said divider.

* * * * *